United States Patent
Niboshi et al.

(10) Patent No.: US 10,381,588 B2
(45) Date of Patent: Aug. 13, 2019

(54) ORGANIC ELECTROLUMINESCENCE ELEMENT, ORGANIC ELECTROLUMINESCENCE DISPLAY DEVICE, AND METHOD FOR PRODUCING ORGANIC ELECTROLUMINESCENCE ELEMENT

(71) Applicant: Sharp Kabushiki Kaisha, Sakai, Osaka (JP)

(72) Inventors: Manabu Niboshi, Sakai (JP); Hideki Uchida, Sakai (JP); Shinji Nakajima, Sakai (JP); Yoshiyuki Isomura, Sakai (JP); Eiji Koike, Sakai (JP); Yuto Tsukamoto, Sakai (JP); Asae Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/773,577

(22) PCT Filed: Nov. 7, 2016

(86) PCT No.: PCT/JP2016/082996
§ 371 (c)(1),
(2) Date: May 4, 2018

(87) PCT Pub. No.: WO2017/082216
PCT Pub. Date: May 18, 2017

(65) Prior Publication Data
US 2018/0331314 A1 Nov. 15, 2018

(30) Foreign Application Priority Data
Nov. 13, 2015 (JP) .................... 2015-222968

(51) Int. Cl.
*H01L 27/00* (2006.01)
*H01L 51/00* (2006.01)
(Continued)

(52) U.S. Cl.
CPC ...... *H01L 51/5036* (2013.01); *H01L 51/5004* (2013.01); *H01L 51/5056* (2013.01);
(Continued)

(58) Field of Classification Search
CPC . H01L 27/1225; H01L 27/3209; H01L 27/15; H01L 51/5221; H01L 51/5206;
(Continued)

(56) References Cited

U.S. PATENT DOCUMENTS

2010/0102310 A1 4/2010 Komatsu et al.
2014/0042423 A1 2/2014 Ohuchi et al.

FOREIGN PATENT DOCUMENTS

JP 2006-245332 A 9/2006
JP 5138542 B2 2/2013
(Continued)

OTHER PUBLICATIONS

Official Communication issued in International Patent Application No. PCT/JP2016/082996, dated Jan. 24, 2017.

*Primary Examiner* — Nikolay K Yushin
(74) *Attorney, Agent, or Firm* — Keating & Bennett, LLP

(57) ABSTRACT

To provide an organic EL element having good injection properties and transport properties of a carrier. Included are: an InGaZnO layer with a composition rich in $In_2O_3$ as a transparent electrode contacting a negative electrode; an InGaZnO layer with a stoichiometric ratio of In:Ga:Zn:O=1:1:1:4 as an electron injecting layer; and an InGaZnO layer with a composition rich in $Ga_2O_3$ as an electron transport layer contacting a light emitting layer.

19 Claims, 13 Drawing Sheets

(51) Int. Cl.
*H01L 51/50* (2006.01)
*H01L 51/52* (2006.01)
*H01L 51/56* (2006.01)
*H01L 27/12* (2006.01)
*H01L 29/786* (2006.01)

(52) U.S. Cl.
CPC ...... *H01L 51/5072* (2013.01); *H01L 51/5088* (2013.01); *H01L 51/5092* (2013.01); *H01L 51/5206* (2013.01); *H01L 51/5221* (2013.01); *H01L 51/56* (2013.01); *H01L 27/1225* (2013.01); *H01L 29/7869* (2013.01); *H01L 51/5218* (2013.01); *H01L 51/5234* (2013.01); *H01L 51/5265* (2013.01); *H01L 2251/5353* (2013.01); *H01L 2251/552* (2013.01)

(58) Field of Classification Search
CPC . H01L 51/5072; H01L 51/56; H01L 51/5056; H01L 51/5036; H01L 51/5004; H01L 51/5092; H01L 2251/552; H01L 2251/53; H01L 2251/303; H01L 2251/305
See application file for complete search history.

(56) References Cited

FOREIGN PATENT DOCUMENTS

| | | |
|---|---|---|
| JP | 2013-062487 A | 4/2013 |
| JP | 2013-062498 A | 4/2013 |
| JP | 2014-154715 A | 8/2014 |
| WO | 2013/128504 A1 | 9/2013 |

| NAME OF THE OXIDE LAYER | InGaZnO LAYER WITH In:Ga:Zn:O = 1:1:1:4 | $In_2O_3$ LAYER | $Ga_2O_3$ LAYER | ZnO LAYER |
|---|---|---|---|---|
| CONDUCTION BAND LEVEL (CB) | -4.0 | -4.5 | -2.2 | -3.8 |
| VALENCE BAND LEVEL (VB) | -7.2 | -8.0 | -7.0 | -7.2 |
| BAND GAP (Eg) | 3.2 | 3.5 | 4.8 | 3.4 |
| FERMI LEVEL (Ef) | -4.2 | -4.0 | -4.6 | -4.0 |

FIG. 6A
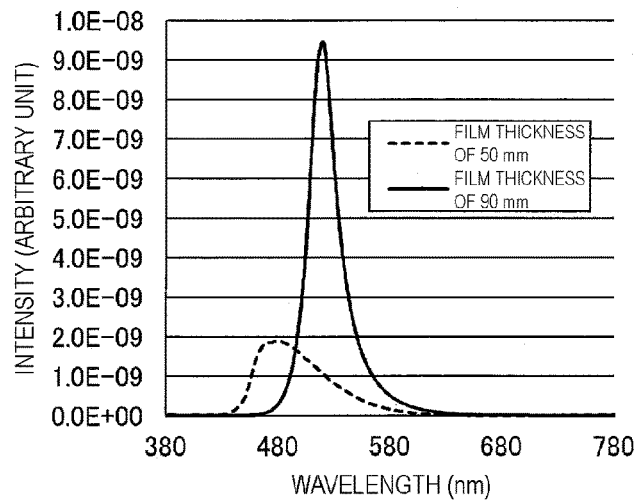
FIG. 6B
| MATERIAL | THICKNESS | FUNCTION |
|---|---|---|
| Ag | 20 nm | POSITIVE ELECTRODE |
| MoO$_3$ | 10 nm | HOLE INJECTING |
| NPD | 60 nm | HOLE TRANSPORT |
| Alq$_3$ | 60 nm | LIGHT EMITTING LAYER |
| InGaZnO | X nm | TRANSPARENT ELECTRODE, ELECTRON INJECTING, AND ELECTRON TRANSPORT |
| IZO | 19 nm | TRANSPARENT ELECTRODE IN THE NEGATIVE ELECTRODE |
| Al | 100 nm | REFLECTIVE ELECTRODE IN THE NEGATIVE ELECTRODE |
| GLASS | 0.7 mm | SUBSTRATE |
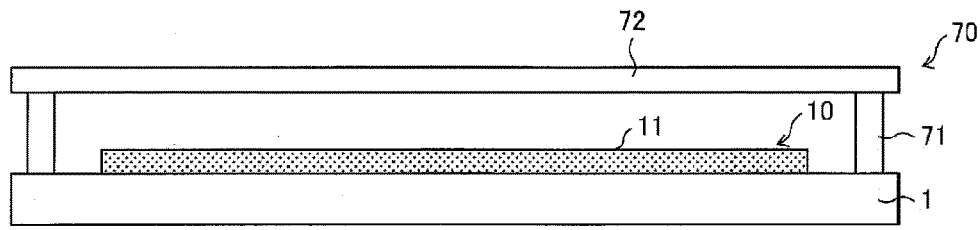
FIG. 7

| MATERIAL | THICKNESS | FUNCTION |
|---|---|---|
| Ag | 20 nm | POSITIVE ELECTRODE |
| MoO$_3$ | 10 nm | HOLE INJECTING |
| NPD | 10 nm | HOLE TRANSPORT |
| Alq$_3$:DCJTB (2 wt%) | 30 nm | LIGHT EMITTING LAYER |
| InGaZnO | X nm | TRANSPARENT ELECTRODE, ELECTRON INJECTING, AND ELECTRON TRANSPORT |
| IZO | 19 nm | TRANSPARENT ELECTRODE IN THE NEGATIVE ELECTRODE |
| Al | 100 nm | REFLECTIVE ELECTRODE IN THE NEGATIVE ELECTRODE |
| GLASS | 0.7 mm | SUBSTRATE |

| MATERIAL | THICKNESS | FUNCTION |
|---|---|---|
| Ag | 20 nm | POSITIVE ELECTRODE |
| $MoO_3$ | 10 nm | HOLE INJECTING |
| NPD | 10 nm | HOLE TRANSPORT |
| CBP:Ir(ppy)$_3$ (10 wt%) | 30 nm | LIGHT EMITTING LAYER |
| InGaZnO | X nm | TRANSPARENT ELECTRODE, ELECTRON INJECTING, AND ELECTRON TRANSPORT |
| IZO | 19 nm | TRANSPARENT ELECTRODE IN THE NEGATIVE ELECTRODE |
| Al | 100 nm | REFLECTIVE ELECTRODE IN THE NEGATIVE ELECTRODE |
| GLASS | 0.7 mm | SUBSTRATE |

| MATERIAL | THICKNESS | FUNCTION |
|---|---|---|
| Ag | 20 nm | POSITIVE ELECTRODE |
| MoO$_3$ | 10 nm | HOLE INJECTING |
| NPD | 10 nm | HOLE TRANSPORT |
| Balq: PERYLENE (1 wt%) | 30 nm | LIGHT EMITTING LAYER |
| InGaZnO | X nm | TRANSPARENT ELECTRODE, ELECTRON INJECTING, AND ELECTRON TRANSPORT |
| IZO | 19 nm | TRANSPARENT ELECTRODE IN THE NEGATIVE ELECTRODE |
| Al | 100 nm | REFLECTIVE ELECTRODE IN THE NEGATIVE ELECTRODE |
| GLASS | 0.7 mm | SUBSTRATE |

ORGANIC ELECTROLUMINESCENCE ELEMENT, ORGANIC ELECTROLUMINESCENCE DISPLAY DEVICE, AND METHOD FOR PRODUCING ORGANIC ELECTROLUMINESCENCE ELEMENT

TECHNICAL FIELD

The disclosure relates to an organic electroluminescence element, an organic electroluminescence display device, and a method for producing an organic electroluminescence element.

BACKGROUND ART

Recently, various flat panel displays have been developed, and in particular, an organic electroluminescence display device (hereinafter, referred to as an organic EL display device) including an organic electroluminescence element (hereinafter, referred to as an organic EL element) has garnered great attention as an excellent flat panel display in terms of being able to achieve reduced power consumption, thinning, higher picture quality, etc.

FIG. 14A is a view describing injection properties and transport properties of an electron carrier in a known organic EL element using an LiF layer as an electron injecting layer.

As illustrated in FIG. 14A, known organic EL elements using an LiF layer as the electron injecting layer include a configuration, wherein an aluminum (Al) layer as a negative electrode, an LiF layer as the electron injecting layer, and an organic electron transport layer (ETL layer) are sequentially layered. In addition, the aluminum (Al) layer as the negative electrode and the LiF layer as the electron injecting layer are bonded by interface diffusion between Al and Li.

In accordance with the above-mentioned configuration, because there is almost no difference between the work function of the aluminum (Al) layer and the lowest unoccupied molecular orbital (LUMO) level of the LiF layer, there is no electron injection barrier, and good injection properties of an electron carrier can be obtained. Because of the small difference between the work function of the LiF layer and the lowest unoccupied molecular orbital (LUMO) level of an organic electron transport layer (ETL layer), good transport properties of an electron carrier can also be obtained.

However, because the LiF used as the electron injecting layer is a material susceptible to degradation under the influence of moisture and oxygen in the atmosphere, strict sealing for blocking moisture and oxygen, etc. in the atmosphere is required upon manufacturing an organic EL display device including an organic EL element with the LiF layer as the electron injecting layer. Such a strict sealing requirement has been a major factor to hinder achieving low costs and flexibility of the organic EL display device.

Accordingly, PTL 1 describes the use of a layer, including metal oxide with a stoichiometric ratio (composition ratio) of In:Ga:Zn:O=1:1:1:4 (hereinafter, referred to as an InGaZnO layer), which is stable in the atmosphere, and has a small work function, as the electron injecting layer.

While an electron injecting layer has been thus far described as one example, with regard to a hole injecting layer, an attempt has been made to use a layer including a metal oxide having a large work function as a hole injecting layer for improving problems, etc. occurring in the production process.

PTL 1 describes a configuration wherein a hole injecting layer including molybdenum trioxide with a single composition is formed between a positive electrode and a hole transport layer, and PTL 2 describes a configuration wherein a hole injecting layer including a mixture of molybdenum oxide and tungsten oxide with a single composition is formed between a positive electrode and an organic light emitting layer.

CITATION LIST

Patent Literature

PTL 1: JP 2014-154715 A (published Aug. 25, 2014)
PTL 2: JP 5138542 B (issued Feb. 6, 2013)

SUMMARY OF INVENTION

Technical Problem

FIG. 14B is a view describing injection properties and transport properties of an electron carrier in an organic EL element using the above-mentioned InGaZnO layer with a single composition instead of an LiF layer as an electron injecting layer.

As illustrated in FIG. 14B, this organic EL element includes a configuration wherein an aluminum (Al) layer as a negative electrode, the above-mentioned InGaZnO layer with a single composition as the electron injecting layer, and an organic electron transport layer (ETL layer) are sequentially layered.

However, in the organic EL element using the above-mentioned InGaZnO layer with a single composition as the electron injecting layer, the difference between the work function of the aluminum (Al) layer and the lowest unoccupied molecular orbital (LUMO) level of the above-mentioned InGaZnO layer is relatively large as compared with the case of using the LiF layer as the electron injecting layer, the injection properties of the electron carrier are deteriorated, and the difference between the work function of the above-mentioned InGaZnO layer and the lowest unoccupied molecular orbital (LUMO) level of the organic electron transport layer (ETL layer) is large, resulting in deteriorated transport properties of the electron carrier. Therefore, the organic EL element using the above-mentioned InGaZnO layer with a single composition as the electron injecting layer has significantly reduced light-emitting characteristics along with a reduced concentration of the electron carrier, resulting in a problem of requiring driving at a high voltage.

Particularly, PTL 1 describes a configuration employing, because of good stability in the atmosphere, an ITO (indium tin oxide) layer as a negative electrode instead of the aluminum (Al) layer, the above-mentioned InGaZnO layer as an electron injecting layer, and a layer including molybdenum trioxide as a hole injecting layer.

FIG. 15A is a view illustrating a schematic configuration of an organic EL element disclosed in PTL 1, and FIG. 15B is a view describing injection properties and transport properties of an electron carrier in the organic EL element using an ITO layer as a negative electrode and the above-mentioned InGaZnO layer with a single composition as an electron injecting layer.

As illustrated in FIG. 15A, an organic EL element 210 is configured such that an ITO layer 202 as a negative electrode, an InGaZnO layer 203, including metal oxide with a stoichiometric ratio (composition ratio) of In:Ga:Zn:O=1:1:1:4, as an electron injecting layer, a buffer layer 204 as an organic electron transport layer, a light emitting layer 205, a hole transport layer 206, a molybdenum trioxide layer 207 as a hole injecting layer, and a metal layer 208 as a positive electrode are sequentially layered on a transparent substrate 210.

However, in such a configuration using the ITO layer as a negative electrode, the work function of the InGaZnO layer, serving as the electron injecting layer, is from −4 to −4.2 eV, while the work function of the ITO layer is −5.7 eV, as illustrated in FIG. 15B, and thus the difference between the work function of the ITO layer and the lowest unoccupied molecular orbital (LUMO) level of the above-mentioned InGaZnO layer is further larger than the difference between the work function of the above-mentioned aluminum (Al) layer and the lowest unoccupied molecular orbital (LUMO) level of the above-mentioned InGaZnO layer, resulting in a problem of further deteriorating the injection properties of the electron carrier.

Therefore, when using a layer including a metal oxide with a single composition as an electron injecting layer, it is difficult to fulfill both injection properties and transport properties of an electron carrier to a satisfactory level.

Moreover, PTLs 1 and 2 disclose the use of a layer including metal oxide with a single composition as a hole injecting layer, specifically, PTL 1 discloses the use of a layer including molybdenum trioxide with a single composition as a hole injecting layer, while PTL 2 discloses the use of a mixture of molybdenum oxide and tungsten oxide with a single composition as a hole injecting layer.

As in the above-mentioned electron injecting layer, when using a layer including a metal oxide with a single composition as a hole injecting layer, it is difficult to fulfill both injection properties and transport properties of a hole carrier to a satisfactory level.

The disclosure has been created in view of the above-mentioned problems, with the object of providing an organic electroluminescence element having good injection properties and transport properties of a carrier (electron or hole), an organic electroluminescence display device, and a method for producing an organic electroluminescence element.

Solution to Problem

In order to solve the above-mentioned problems, an organic electroluminescence element of the disclosure includes:
    a positive electrode;
    a negative electrode; and
    a light emitting layer between the positive electrode and the negative electrode;
    wherein between either one electrode of the positive electrode or the negative electrode and the light emitting layer, at least a composite metal oxide layer including a first metal oxide layer contacting the one electrode and a second metal oxide layer is formed,
    the first metal oxide layer is composed of a first metal oxide including one or more metal oxides, and the second metal oxide layer is composed of a second metal oxide including one or more metal oxides, and
    one orbital level of the lowest unoccupied molecular orbital level and the highest occupied molecular orbital level of the first metal oxide layer is closer to the work function of the one electrode than the one orbital level of the second metal oxide layer.

In accordance with the above-mentioned configuration, at least the composite metal oxide layer including the first metal oxide layer contacting the one electrode and the second metal oxide layer is provided; and one orbital level of the lowest unoccupied molecular orbital level and the highest occupied molecular orbital level of the first metal oxide layer is closer to the work function of the one electrode than the one orbital level of the second metal oxide layer. In addition, the above-mentioned composite metal oxide layer is a metal oxide layer having high carrier mobility.

Consequently, an organic electroluminescence element that can satisfy both injection properties and transport properties of a carrier (electron or hole) can be achieved.

In order to solve the above-mentioned problems, a method for producing an organic electroluminescence element according to the disclosure includes:
    forming a positive electrode;
    forming a negative electrode; and
    forming a light emitting layer between the positive electrode and the negative electrode;
    wherein the method further includes forming, between either one electrode of the positive electrode or the negative electrode and the light emitting layer, at least a composite metal oxide layer including a first metal oxide layer contacting the one electrode and a second metal oxide layer,
    in forming the composite metal oxide layer,
    the first metal oxide layer and the second metal oxide layer are formed such that one orbital level of the lowest unoccupied molecular orbital level and the highest occupied molecular orbital level of the first metal oxide layer composed of a first metal oxide including one or more metal oxides is closer to the work function of the one electrode than the one orbital level of the second metal oxide layer composed of a second metal oxide including one or more metal oxides.

In accordance with the above-mentioned method, because an organic electroluminescence element including the composite metal oxide layer including the first metal oxide layer contacting the above-mentioned one electrode and the second metal oxide layer can be produced, an organic electroluminescence element that can satisfy both injection properties and transport properties of a carrier (electron or hole) can be achieved.

Advantageous Effects of Invention

One aspect of the disclosure enables the provision of an organic electroluminescence element having good injection properties and transport properties of a good carrier (electron or hole), an organic electroluminescence display device, and a method for producing an organic electroluminescence element.

BRIEF DESCRIPTION OF DRAWINGS

FIG. 6A is a view illustrating simulation calculation results of the extraction intensity of light from above in an organic EL element emitting green light, for film thicknesses from 50 nm and 90 nm of InGaZnO layers including three layers with different compositions, and FIG. 6B illustrates a material, thickness, and function of each layer used in the simulation calculation.

FIG. 7 is a view illustrating a schematic configuration of an organic EL display device.

DESCRIPTION OF EMBODIMENTS

Embodiments of the disclosure will be described based on FIGS. 1 to 13B as follows. Hereinafter, for convenience of description, a configuration having the same function as the configuration described in the specific embodiment is appended with the same reference symbols, with the description thereof and the description thereof may be omitted.

Embodiment 1

Schematic configurations of an organic EL element (organic electroluminescence element) 10 and the production process of the organic EL element 10 will be described based on FIGS. 1 to 7.

Figure 1:
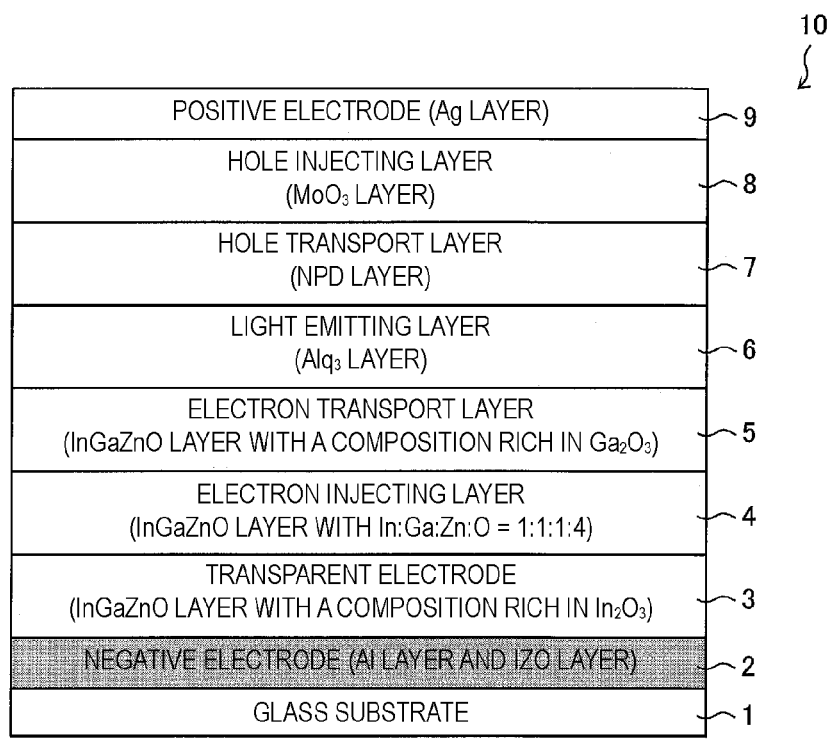
FIG. 1 is a view illustrating a schematic configuration of the organic EL element according to Embodiment 1 of the disclosure.

FIG. 1 is a view illustrating a schematic configuration of the organic EL element 10.

As illustrated in FIG. 1, the organic EL element 10 is configured such that a negative electrode 2, a transparent electrode 3, an electron injecting layer 4, an electron transport layer 5, a light emitting layer 6, a hole transport layer 7, a hole injecting layer 8, and a positive electrode 9 are sequentially layered on a glass substrate 1.

In the present embodiment, use of the glass substrate 1 as a substrate will be described as one example, but not limited thereto, for example, a resin substrate, etc. can also be used, and in particular for, e.g., manufacturing a flexible organic EL display device, a flexible substrate may be used.

As the negative electrode 2, a layered film with an IZO (indium zinc oxide) layer layered on an Al layer is used, and the organic EL element 10 is a top emission type; thus, the Al layer described above is included as a reflective electrode; and in view of the stability in the atmosphere, the IZO layer is layered on the Al layer described above. Therefore, other metal layers having good reflectivity along with good conductivity may be used instead of the Al layer described above, and other metal oxide layers such as an ITO layer stable in the atmosphere and having good conductivity may be used instead of the IZO layer.

As the transparent electrode 3, an InGaZnO layer with a composition rich in $In_2O_3$ is used. An InGaZnO layer with a composition rich in $In_2O_3$ means an InGaZnO layer with a composition of X>2, Y>2, Z>0 in a stoichiometric ratio (composition ratio) of In:Ga:Zn:O=X:1:Y:Z. Such an InGaZnO layer with a composition rich in $In_2O_3$ has high conductivity with low resistance, as well as a work function of lower than −4 eV, and good contact with the negative electrode 2.

As the electron injecting layer 4, an InGaZnO layer with X=1, Y=1, and Z=4 in a stoichiometric ratio of In:Ga:Zn:O=X:1:Y:Z, i.e., a stoichiometric ratio of In:Ga:Zn:O=1:1:1:4, is used.

As the electron transport layer 5, an InGaZnO layer with a composition rich in $Ga_2O_3$ is used. An InGaZnO layer with a composition rich in $Ga_2O_3$ means an InGaZnO layer with a composition of 0<X<2, 0<Y<2, Z>0 in a stoichiometric ratio of In:Ga:Zn:O=X:1:Y:Z. Because the physical properties of this InGaZnO layer with a composition rich in $Ga_2O_3$ are close to the physical properties of $Ga_2O_3$, the conduction band level (CB), i.e., the LUMO (Low Unoccupied Molecular Orbital) level is approximately −3 eV.

Because the InGaZnO layer with a composition rich in $In_2O_3$ as the transparent electrode 3, the InGaZnO layer with a stoichiometric ratio of In:Ga:Zn:O=1:1:1:4 as the electron injecting layer 4, and the InGaZnO layer with a composition rich in $Ga_2O_3$ as the electron transport layer 5 all have high carrier mobility, any change in the thickness of each layer does not cause a significant change in the carrier mobility of each layer. Preferred film thickness for each layer will be described later.

The layer contacting the negative electrode 2 is an InGaZnO layer (a first metal oxide layer) with a composition rich in $In_2O_3$ as the transparent electrode 3, the layer contacting the light emitting layer 6 is an InGaZnO layer (a second metal oxide layer) with a composition rich in $Ga_2O_3$ as the electron transport layer 5. The InGaZnO layer with a composition rich in $In_2O_3$ as the transparent electrode 3, the InGaZnO layer (a third metal oxide layer) with a stoichiometric ratio of In:Ga:Zn:O=1:1:1:4 as the electron injecting layer 4, and the InGaZnO layer with a composition rich in $Ga_2O_3$ as the electron transport layer 5 are composite metal oxide layers.

As the light emitting layer 6, an $Alq_3$ layer is used because the organic EL element 10 is an organic EL element emitting green light, but not limited thereto, other materials can be selected from known light emitting materials as appropriate.

Note that the organic EL element 10 is a microcavity (microresonator) organic EL element, and in the microcavity organic EL element, the light emission spectrum is made steep and the light emission intensity at a specific wavelength is amplified by multiply reflecting and resonating the emitted light between the positive electrode and the negative electrode. Such a microcavity effect can be obtained, for example, by optimally designing the reflectivity and film thickness of the positive electrode and negative electrode, the layer thickness of the organic layer, etc.

As a method for introducing such a resonance structure, i.e., a microcavity structure, into the organic EL element, for example, a method for changing the optical path length of the organic EL element in each sub pixel for each luminescent color is known. In the present embodiment, the optical path length of the organic EL element is changed by adjusting the distance between the Al layer and the light emitting layer 6, and specifically, the InGaZnO layer with a composition rich in $In_2O_3$ as the transparent electrode 3, the InGaZnO layer with a stoichiometric ratio of In:Ga:Zn:O=1:1:1:4 as the electron injecting layer 4, and the InGaZnO layer with a composition rich in $Ga_2O_3$ as the electron transport layer 5 are used. The microcavity organic EL element enables improvement in the chromaticity of light emission and the light emission efficiency by the microcavity effect.

Moreover, in the present embodiment, microcavity organic EL elements are an NPD layer as the hole transport layer 7, an $MoO_3$ layer as the hole injecting layer 8, and the organic EL element 10 as the positive electrode 9, and thus an Ag layer is used in each layer to form a semitransparent reflective electrode. For these layers, however, not limited thereto, other materials can be selected from known materials as appropriate.

As described so far, the electron transport layer 5 is a layer for transporting the electron carrier, and the hole transport layer 7 is a layer for transporting the hole carrierm and thus both the electron transport layer 5 and the hole transport layer 7 are carrier transport layers.

Hereinafter, in the present embodiment, reasons will be described respectively for selecting the InGaZnO layer with a composition rich in $In_2O_3$ as the transparent electrode 3 contacting the negative electrode 2, the InGaZnO layer with a stoichiometric ratio of In:Ga:Zn:O=1:1:1:4 as the electron injecting layer 4, and the InGaZnO layer with a composition rich in $Ga_2O_3$ as the electron transport layer 5 contacting the light emitting layer 6.

The InGaZnO layer with a composition rich in $In_2O_3$ as the transparent electrode 3 contacting the negative electrode 2, the InGaZnO layer with a stoichiometric ratio of In:Ga:Zn:O=1:1:1:4 as the electron injecting layer 4, and the InGaZnO layer with a composition rich in $Ga_2O_3$ as the electron transport layer 5 contacting the light emitting layer 6 are all composed of $In_2O_3$, $Ga_2O_3$, and ZnO, with the contents thereof optimized depending on whether they are used as the transparent electrode 3, the electron injecting layer 4, or the electron transport layer 5.

Accordingly, described below are results from studies, wherein an $In_2O_3$ layer including $In_2O_3$, a $Ga_2O_3$ layer including $Ga_2O_3$, a ZnO layer including ZnO, and an InGaZnO layer with a stoichiometric ratio of In:Ga:Zn:O=1:1:1:4 were studied for physical properties.

Figures 2A, 2B:
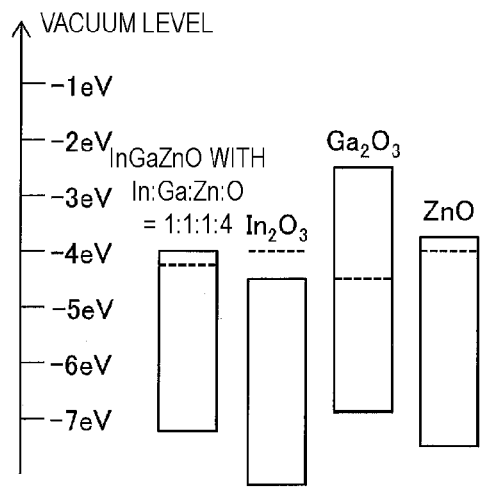
FIG. 2A is a band diagram of an InGaZnO layer, an $In_2O_3$ layer, a $Ga_2O_3$ layer, and a ZnO layer.
FIG. 2B is a view illustrating physical properties thereof.

FIG. 2A is a band diagram of an InGaZnO layer with a stoichiometric ratio of In:Ga:Zn:O=1:1:1:4, an $In_2O_3$ layer including $In_2O_3$, a $Ga_2O_3$ layer including $Ga_2O_3$, and a ZnO layer including ZnO, and FIG. 2B is a view illustrating the physical properties of the InGaZnO layer with a stoichiometric ratio of In:Ga:Zn:O=1:1:1:4, the $In_2O_3$ layer including $In_2O_3$, the $Ga_2O_3$ layer including $Ga_2O_3$, and the ZnO layer including ZnO. Note that the band diagram of each layer illustrated in FIG. 2A, and the physical properties of each layer illustrated in FIG. 2B, are those described in the Journal of Non-Crystaliine Solids 354 (2008) 2791-2795, J. Robertson.

First, the transparent electrode 3 contacting the negative electrode 2 is required to have good contact with the negative electrode 2, i.e., an IZO layer, have low resistance, and have a small difference between the work function (−4.7 eV) of the IZO layer and the lowest unoccupied molecular orbital (LUMO) level of the transparent electrode 3 (the work function of the IZO layer is close to the LUMO level of the transparent electrode 3).

As illustrated in FIGS. 2A and 2B, the $In_2O_3$ layer including $In_2O_3$ has a conduction band level (CB) of −4.5 eV, a valence band level (VB) of −8.0 eV, and a band gap (Eg) of 3.5 eV, with the Fermi level (Ef) indicated by dotted lines in FIG. 2A being −4.0 eV. Note that the work function can be calculated from the difference between the vacuum level and the Fermi level (Ef). Because the conduction band level (CB) of the $In_2O_3$ layer including $In_2O_3$, i.e., the lowest unoccupied molecular orbital (LUMO) level thereof, is −4.5 eV, the difference from the work function of the IZO layer is presumably smallest, and among the InGaZnO layer with a stoichiometric ratio of In:Ga:Zn:O=1:1:1:4, the $In_2O_3$ layer including $In_2O_3$, the $Ga_2O_3$ layer including $Ga_2O_3$, and the ZnO layer including ZnO, the $In_2O_3$ layer including $In_2O_3$ has the most preferred physical properties as the transparent electrode 3 contacting the negative electrode 2.

Accordingly, in the present embodiment, an InGaZnO layer with a composition rich in $In_2O_3$ is used as the transparent electrode 3 contacting the negative electrode 2 because it is rich in $In_2O_3$ among $In_2O_3$, $Ga_2O_3$ and ZnO, and thus its physical properties are close to those of the $In_2O_3$ layer including $In_2O_3$. Note that as mentioned above, the InGaZnO layer with a composition rich in $In_2O_3$ means an InGaZnO layer with a composition of X>2, Y>2, Z>0 in a stoichiometric ratio (composition ratio) of In:Ga:Zn:O=X:1:Y:Z.

Then, the electron injecting layer 4 is required to have a small difference between the lowest unoccupied molecular orbital (LUMO) level of the electron injecting layer 4 and the work function of the transparent electrode 3 (the lowest unoccupied molecular orbital (LUMO) level of the electron injecting layer 4 is close to the work function of the transparent electrode 3).

As illustrated in FIGS. 2A and 2B, the InGaZnO layer with a stoichiometric ratio of In:Ga:Zn:O=1:1:1:4 has a conduction band level (CB) of −4.0 eV, a valence band level (VB) of −7.2 eV, and a band gap (Eg) of 3.2 eV, with the Fermi level (Ef) indicated by dotted lines in FIG. 2A being −4.2 eV. Because the InGaZnO layer with a stoichiometric ratio of In:Ga:Zn:O=1:1:1:4 has a conduction band level (CB), i.e., a LUMO level of −4.0 eV, and the $In_2O_3$ layer including $In_2O_3$ has a Fermi level (Ef) of −4.0 eV, among the InGaZnO layer with a stoichiometric ratio of In:Ga:Zn:O=1:1:1:4, the $In_2O_3$ layer including $In_2O_3$, the $Ga_2O_3$ layer including $Ga_2O_3$, and the ZnO layer including ZnO, the InGaZnO layer with a stoichiometric ratio of In:Ga:Zn:O=1:1:1:4, has the most preferred physical properties as the electron injecting layer 4.

Accordingly, in the present embodiment, the InGaZnO layer with a stoichiometric ratio of In:Ga:Zn:O=1:1:1:4 is used as the electron injecting layer 4.

In addition, the electron transport layer 5 is required to have a small difference between the lowest unoccupied molecular orbital (LUMO) level (−2.9 eV) of the light emitting layer 6 and the work function of the electron transport layer 5 (the lowest unoccupied molecular orbital (LUMO) level of the light emitting layer 6 is close to the work function of the electron transport layer 5). In view of the lowest unoccupied molecular orbital (LUMO) level of the light emitting layer 6, the electron transport layer 5 is required to achieve a low work function.

As illustrated in FIGS. 2A and 2B, the $Ga_2O_3$ layer including $Ga_2O_3$ has a conduction band level (CB) of −2.2 eV, a valence band level (VB) of −7.0 eV, and a band gap (Eg) of 4.8 eV, with the Fermi level (Ef) indicated by dotted lines in FIG. 2A being −4.6 eV. In a case where the $Ga_2O_3$ layer including $Ga_2O_3$ has a conduction band level (CB), i.e., a LUMO level, as high as −2.2 eV, and the localized level of electrons is formed at or near this conduction band level (CB), a low work function as low as −2.2 eV can be achieved. Therefore, among the InGaZnO layer with a stoichiometric ratio of In:Ga:Zn:O=1:1:1:4, the $In_2O_3$ layer including $In_2O_3$, the $Ga_2O_3$ layer including $Ga_2O_3$, and the ZnO layer including ZnO, the $Ga_2O_3$ layer including $Ga_2O_3$ has the most preferred physical properties as the electron transport layer 5.

Accordingly, in the present embodiment, an InGaZnO layer with a composition rich in $Ga_2O_3$ is used as the electron transport layer 5 because it is rich in $Ga_2O_3$ among $In_2O_3$, $Ga_2O_3$, and ZnO, and thus its physical properties are close to those the $Ga_2O_3$ layer including $Ga_2O_3$. Note that as mentioned above, the InGaZnO layer with a composition rich in $Ga_2O_3$ means an InGaZnO layer with a composition of 0<X<2, 0<Y<2, Z>0 in a stoichiometric ratio of In:Ga:Zn:O=X:1:Y:Z. In addition, the work function of the InGaZnO layer with a composition rich in $Ga_2O_3$ as the electron transport layer 5 is approximately −2.2 eV for the above-mentioned reasons.

Note that, as illustrated in FIGS. 2A and 2B, the ZnO layer including ZnO has a conduction band level (CB) of −3.8 eV, a valence band level (VB) of −7.2 eV, and a band gap (Eg) of 3.4 eV, with the Fermi level (Ef) indicated by dotted lines in FIG. 2A being −4.0 eV.

Described below are results from measurements, in the present embodiment, wherein the absorbances of the InGaZnO layer with a composition rich in $Ga_2O_3$ used as the electron transport layer 5 and the InGaZnO layer with a stoichiometric ratio of In:Ga:Zn:O=1:1:1:4 used as the electron injecting layer 4 were measured to compare with a measurement result of the absorbance of a BaO layer having a low work function.

Figure 3:
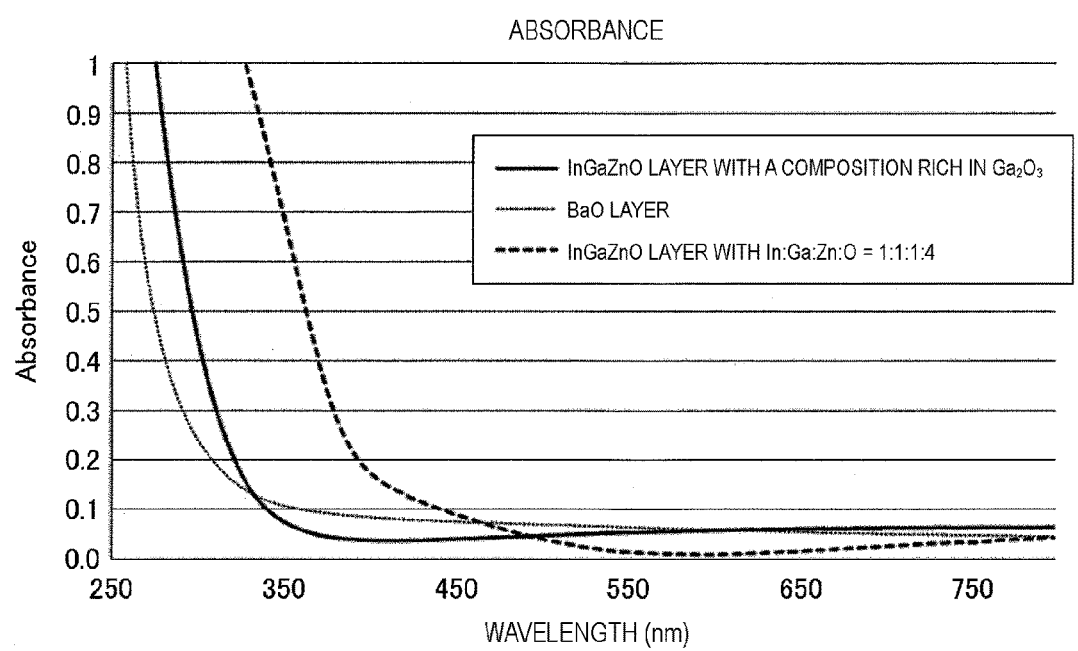
FIG. 3 is a view illustrating the measurement results of the absorbance of InGaZnO layers having different compositions.

FIG. 3 is a view illustrating the measurement results of the absorbances of the BaO layer having a low work function as a comparative example, the InGaZnO layer with a stoichiometric ratio of In:Ga:Zn:O=1:1:1:4, and the InGaZnO layer with a composition rich in $Ga_2O_3$.

As illustrated, as the BaO layer having a low work function has a shallow conduction band level (CB), and its band gap is relatively large, it absorbs light on a short wavelength side. In addition, it is understood that as the InGaZnO layer with a composition rich in $Ga_2O_3$ has a light absorption wavelength region approximate to the light absorption wavelength region in the BaO layer described above, it has properties close to those of the BaO layer. That is, the InGaZnO layer with a composition rich in $Ga_2O_3$, like the BaO layer, has a shallow conduction band level (CB), its band gap is relatively large, and it has a low work function. In contrast, as the InGaZnO layer with a stoichiometric ratio of In:Ga:Zn:O=1:1:1:4 absorbs light on a long wavelength side as compared with the BaO layer and the InGaZnO layer with a composition rich in $Ga_2O_3$, it has a relatively deep conduction band level (CB), and its band gap is relatively small.

Hereinafter, the production process of the organic EL element 10 illustrated in FIG. 1 will be described based on FIG. 4.

Figure 4:
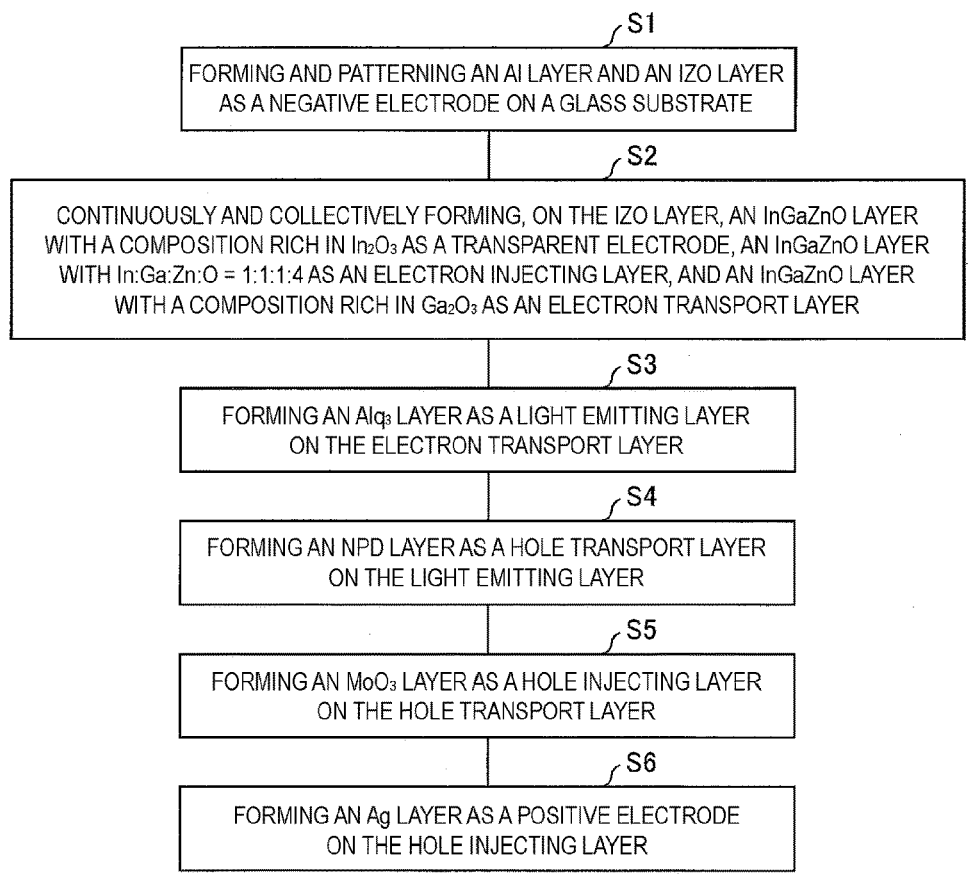
FIG. 4 is a view describing the production process of the organic EL element illustrated in FIG. 1.

FIG. 4 is a view describing the production process of the organic EL element 10 illustrated in FIG. 1.

As illustrated, first, in a step (S1) of forming and patterning the Al layer and the IZO layer as the negative electrode 2 on the glass substrate 1, the Al layer having a film thickness of 100 nm and the IZO layer having a film thickness of 19 nm are sequentially layered on the glass substrate, the IZO layer, which is an upper layer, is selectively etched with oxalic acid, subsequently the Al layer is etched with phosphoric acid, nitric acid, and acetic acid, and the negative electrode 2 including the Al layer and the IZO layer can be formed in a predetermined pattern. Note that the reason for selecting an IZO layer as a layer to be formed on an Al layer is that an Al layer is not susceptible to electric corrosion with an IZO layer.

Described next is a step (S2) of continuously and collectively forming, on the above-mentioned IZO layer, the InGaZnO layer with a composition rich in $In_2O_3$ as the transparent electrode 3, the InGaZnO layer with In:Ga:Zn:O=1:1:1:4 as the electron injecting layer 4, and the InGaZnO layer with a composition rich in $Ga_2O_3$ as the electron transport layer 5.

The InGaZnO layer with a composition rich in $In_2O_3$, the InGaZnO layer with In:Ga:Zn:O=1:1:1:4, and the InGaZnO layer with a composition rich in $Ga_2O_3$ are all composed of $In_2O_3$, $Ga_2O_3$, and ZnO, with the contents of $In_2O_3$, $Ga_2O_3$, and ZnO optimized depending on whether they are used as the transparent electrode 3, the electron injecting layer 4, or the electron transport layer 5.

The InGaZnO layer with a composition rich in $In_2O_3$, the InGaZnO layer with In:Ga:Zn:O=1:1:1:4, and the InGaZnO layer with a composition rich in $Ga_2O_3$ may be formed by Physical Vapor Deposition (PVD) such as sputtering and ion plating; alternatively, they may be formed by Chemical Vapor Deposition (CVD) using TMI, TMG, and DEZn gases.

First, on the IZO layer of the negative electrode 2, the InGaZnO layer with a composition rich in $In_2O_3$, the InGaZnO layer with In:Ga:Zn:O=1:1:1:4, and the InGaZnO layer with a composition rich in $Ga_2O_3$ are sequentially deposited. When these three layers are formed by PVD such as sputtering and ion plating, the three layers can be continuously and collectively formed only by changing a source material such as a target material in a deposition step for each layer. In contrast, when these three layers are formed by CVD, the three layers can be continuously and collectively formed only by changing gas mixing ratio in a deposition step for each layer. Note that the preferred film thickness of the InGaZnO layer with a composition rich in $In_2O_3$, the InGaZnO layer with In:Ga:Zn:O=1:1:1:4, and the InGaZnO layer with a composition rich in $Ga_2O_3$ will be described later.

Then, in a step (S3) of forming the $Alq_3$ layer as the light emitting layer 6 on the electron transport layer 5, the $Alq_3$ layer is deposited with a film thickness of 60 nm on the electron transport layer 5. Subsequently, in a step (S4) of forming the NPD layer as the hole transport layer 7 on the light emitting layer 6, the NPD layer is deposited with a film thickness of 60 nm on the light emitting layer 6. And then, in a step (S5) of forming the $MoO_3$ layer as the hole injecting layer 8 on the hole transport layer 7, the $MoO_3$ layer is deposited with a film thickness of 10 nm on the hole transport layer 7. Finally, in a step (S6) of forming the Ag layer as the positive electrode 9 on the hole injecting layer 8 (S6), the Ag layer is deposited with a film thickness of 20 nm on the hole injecting layer 8.

The thus manufactured organic EL element 10 is a top emission type capable of extracting light via the positive electrode 9, which is an Ag layer thinly formed.

Figure 5:
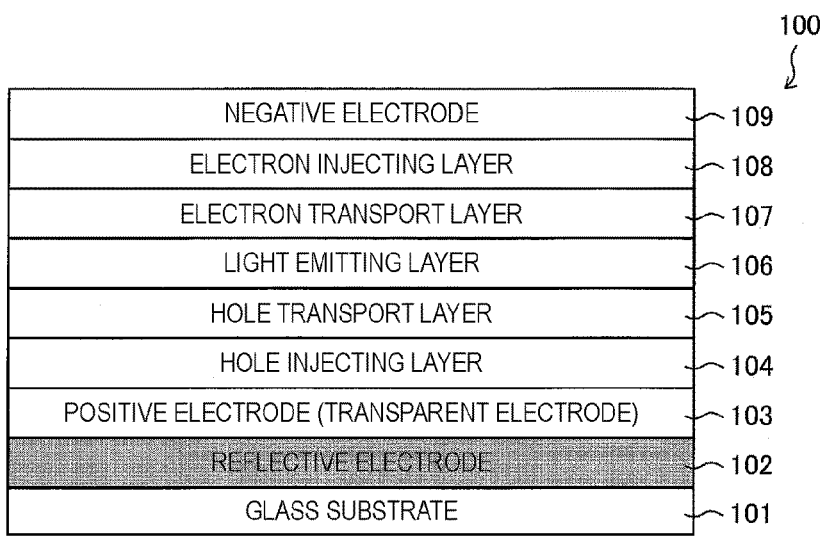
FIG. 5 is a view describing the layering order of each layer used in the related art in a known top emission type organic EL element.

FIG. 5 is a view describing the layering order of each layer used in the related art in a known top emission type organic EL element 100.

As illustrated, the organic EL element 100 is configured such that a reflective electrode 102, a positive electrode (transparent electrode) 103, a hole injecting layer 104, a hole transport layer 105, a light emitting layer 106, an electron transport layer 107, an electron injecting layer 108, and a negative electrode 109 are sequentially layered on a glass substrate 101. In addition, because the organic EL element 100 is a top emission type, it can extract light via the negative electrode 109.

Because the layering order of the electron injecting layer 4, the electron transport layer 5, the light emitting layer 6, the hole transport layer 7, and the hole injecting layer 8 in the organic EL element 10 illustrated in FIG. 1 is completely reversed to that of the hole injecting layer 104, the hole transport layer 105, the light emitting layer 106, the electron transport layer 107, and the electron injecting layer 108 in the organic EL element 100 illustrated in FIG. 5, the organic EL element 10 is referred to as an organic EL element having a reverse layering structure, while the organic EL element 100 is referred to as an organic EL element having a sequential layering structure.

Advantages of an organic EL element having a reverse layering structure may include the following.

First, even in a case where an electron injecting layer with poor moisture resistance is used, improved reliability of the organic EL element can be expected because the electron injecting layer is disposed in the lower layer. In addition, although not illustrated in FIGS. 1 and 5, on the glass substrate 1 and the glass substrate 101, TFT elements, a plurality of active elements, are formed, and to a drain electrode (or a source electrode) of each TFT element, the negative electrode, positive electrode, and reflective electrode of the organic EL element are electrically connected. When the TFT elements are N type TFT elements and include InGaZnO layers, which are oxide semiconductor layers, as the semiconductor layers thereof, it is known to be preferred that the negative electrode of the organic EL element be directly electrically connected to the drain electrode (or the source electrode) of the TFT elements because of the properties thereof. As illustrated in FIG. 1, in the organic EL element 10 having a reverse layering structure, because the negative electrode 2 is disposed immediately above the glass substrate 1 including the TFT elements, even in a case where the TFT elements provided in the glass substrate 1 are N type TFT elements, and include InGaZnO layers, which are oxide semiconductor layers, as the semiconductor layers thereof, the negative electrode 2 can be directly electrically connected to the drain electrode (or the source electrode) of the TFT elements, thereby advantageously achieving an organic EL element 10 having good light-emitting characteristics.

In contrast, as illustrated in FIG. 5, in the organic EL element 100 having a sequential layering structure, because the negative electrode 109 is disposed farthest from the glass substrate 101 including the TFT elements, it is difficult to directly electrically connect the negative electrode 109 to the drain electrode (or the source electrode) of the TFT elements. Therefore, in the organic EL element 100 having a sequential layering structure, it is not preferred to use, as the active elements, N type TFT elements including an InGaZnO layer as a semiconductor layer.

Moreover, LiF and Li often used in general in the related art as the electron injecting layer are known to be ineffective in a case where not deposited on an organic film. For example, in a case where LiF and Li are used as they are as the electron injecting layer, and the reverse layering structure as illustrated in FIG. 1 is incorporated, an electron injecting layer including LiF and Li is formed on the transparent electrode 3, which is not an organic film. Therefore, with such a configuration, the electron injecting layer including LiF and Li does not function as an electron injecting layer.

The reason that it functions as an electron injecting layer when the electron injecting layer including LiF and Li is formed on the organic film is presumably, for example, because when LiF is deposited on the organic film, F is eliminated, and $Li^+$ ions are virtually ion-implanted into the organic film; alloying with the Al layer, the negative electrode immediately above the electron injecting layer including LiF and Li as illustrated in FIG. 5, enables formation of a good bonding layer and thereby achieving ohmic junction, and the like.

As mentioned above, the organic EL element 10 is a microcavity organic EL element, and thus in the present embodiment, the light emission spectrum is made steep, and the light emission intensity at the peak wavelength is amplified by optimizing the distance between the Al layer, which is the reflective layer in the lower layer, and the light emitting layer 6 depending on the wavelength of light from the light emitting layer 6; and by multiply reflecting and resonating light emitted from the light emitting layer 6 between the positive electrode 9 and the Al layer.

Accordingly, described below are simulation calculation results for the optimal value of the distance between the Al layer, which is the reflective layer in the lower layer, and the light emitting layer 6 in an organic EL element 10 emitting green light.

FIG. 6A is a view illustrating simulation calculation results of the extraction intensity of light from above in the organic EL element 10 emitting green light, for film thicknesses from 50 nm and 90 nm of InGaZnO layers including three layers with different compositions, and FIG. 6B illustrates a material, thickness, and function of each layer used in the simulation calculation of FIG. 6A.

Note that representing the thickness of InGaZnO including three layers with different compositions as X nm in FIG. 6B is due to the possibility that the total thickness of the InGaZnO layer with a composition rich in $In_2O_3$, the InGaZnO layer with a stoichiometric ratio of In:Ga:Zn:O=1:1:1:4, and the InGaZnO layer with a composition rich in $Ga_2O_3$, i.e., the film thickness of an InGaZnO layer including three layers with different compositions, may be changed.

The light emitting layer 6 of the organic EL element 10 includes the $Alq_3$ layer, with a peak wavelength of green light emitted from the organic EL element 10 of 520 nm.

As illustrated in FIG. 6A, the InGaZnO layers including three layers with different compositions are compared for film thicknesses from 50 nm and 90 nm to show that extraction intensity of light from above is higher for 90 nm at or near 520 nm, which is the peak wavelength of the light-emitting light.

In addition, chromaticity for the InGaZnO layer including three layers with different compositions and with a film thickness of 50 nm is CIE (x, y)=(0.15, 0.33), while chromaticity for the InGaZnO layer including three layers with different compositions and with a film thickness of 90 nm is CIE (x, y)=(0.18, 0.71). The InGaZnO layer including three layers with different compositions and with a film thickness of 90 nm provides green light emission with higher chromaticity than that of the original green from the $Alq_3$ layer, serving as the light emitting layer 6.

Thus, setting the film thickness of 90 nm for the InGaZnO layer including three layers with different compositions enables efficient emission of green light and improved chromaticity even in a case where an $Alq_3$ layer, which originally has poor chromaticity, is used as the light emitting layer 6.

In the organic EL element 10, together with an IZO layer with a film thickness of 19 nm, the InGaZnO layer with a composition rich in $In_2O_3$, the InGaZnO layer with In:Ga:Zn:O=1:1:1:4, and the InGaZnO layer with a composition rich in $Ga_2O_3$ are inserted between the Al layer and the light emitting layer 6, and thus adjustment of the film thicknesses of these three layers can easily optimize the distance between the Al layer and the light emitting layer 6.

Note that for the InGaZnO layer with a composition rich in $In_2O_3$, the InGaZnO layer with In:Ga:Zn:O=1:1:1:4, and the InGaZnO layer with a composition rich in $Ga_2O_3$, the film thickness of each layer is preferably adjusted within the following ranges.

The InGaZnO layer with a composition rich in $Ga_2O_3$ is preferably adjusted to have a film thickness of 10 nm or less, e.g., from 5 nm to 10 nm, the InGaZnO layer with In:Ga:Zn:O=1:1:1:4 is preferably adjusted to have a film thickness of 20 nm or less, e.g., from 10 nm to 20 nm, and the InGaZnO layer with a composition rich in $In_2O_3$ is preferably adjusted to have a film thickness of 75 nm or less, e.g., from 20 nm to 75 nm.

Because the InGaZnO layer with a composition rich in $Ga_2O_3$ is a functional layer having properties of the lowest work function and easily releasing electrons, in a case where it is formed too thick, the performance thereof may be reduced, and thus it is preferably adjusted to have a film thickness of 10 nm or less.

The InGaZnO layer with In:Ga:Zn:O=1:1:1:4 is a chemically stable layer and $Ga_2O_3$ provided in the upper layer is chemically active, allowing it to play a role in preventing the diffusion of $Ga^{3+}$ particularly to the lower layer. In addition, its film thickness is preferably adjusted from a thickness equal to, to twice the thickness of the InGaZnO layer with a composition rich in $Ga_2O_3$, i.e., 20 nm or less.

The InGaZnO layer with a composition rich in $In_2O_3$ means an InGaZnO layer with X>2, Y>2, Z>0 in a stoichiometric ratio (composition ratio) of In:Ga:Zn:O=X:1:Y:Z which is a low-resistance layer with a work function lower than −4 eV, and good contact with the negative electrode 2, and it may have a composition containing, for example, mainly $In_2O_3$ and ZnO. Because this InGaZnO layer with a composition rich in $In_2O_3$ is not susceptible to electrical influence, its film thickness can be relatively freely changed and it is preferred to adjust to have a film thickness of 75 nm or less.

In the present embodiment, because the InGaZnO layer having high carrier mobility and a composition rich in $In_2O_3$, the InGaZnO layer with a stoichiometric ratio of In:Ga:Zn:O=1:1:1:4, and the InGaZnO layer with a composition rich in $Ga_2O_3$ are used to optimize the distance between the Al layer and the light emitting layer 6, no loss in carrier properties occurs.

Note that in the present embodiment, although the organic EL element 10 emitting green light has been described as one example, also for organic EL elements emitting red light and organic EL elements emitting blue light, it is a matter of course that the distance between the Al layer and the light emitting layer 6 can be optimized as in Embodiment 2 mentioned later.

FIG. 7 is a view illustrating a schematic configuration of an organic EL display device 70 including organic EL elements 10 emitting red light, organic EL elements 10 emitting blue light, and organic EL elements 10 emitting green light, with each distance between the Al layer and the light emitting layer optimized.

As illustrated, the negative electrode 2, the transparent electrode 3, the electron injecting layer 4, the electron transport layer 5, the light emitting layer 6 corresponding to each color, the hole transport layer 7, the hole injecting layer 8, and the positive electrode 9 are sequentially layered on the glass substrate 1 to form a layered film 11, and the organic EL display device 70 includes a plurality of organic EL elements 10 emitting red light, organic EL elements 10 emitting blue light, and organic EL elements 10 emitting green light.

In the organic EL display device 70, the glass substrate 1 and a sealing substrate 72 are pasted together with a sealing resin 71. Note that the sealing resin 71 is formed on four side end portions of the glass substrate 1.

Note that in the present embodiment, the top emission type microcavity organic EL element has been described as one example, but not limited thereto, the disclosure can be usefully used for a bottom emission type organic EL element and organic EL elements other than a microcavity system.

In the present embodiment, one example has been described, wherein the InGaZnO layer with a composition rich in $In_2O_3$, the InGaZnO layer with a stoichiometric ratio of In:Ga:Zn:O=1:1:1:4, and the InGaZnO layer with a composition rich in $Ga_2O_3$ are inserted between the negative electrode 2 and the light emitting layer 6, but not limited thereto, a configuration may be used, wherein the InGaZnO layer with a stoichiometric ratio of In:Ga:Zn:O=1:1:1:4, which is an intermediate layer, is omitted, and only two layers are inserted between the negative electrode 2 and the light emitting layer 6.

Moreover, in the present embodiment, use of the InGaZnO layer with a composition rich in $In_2O_3$ as a layer contacting an IZO layer of the negative electrode 2 has been described as one example, but not limited thereto, instead of the InGaZnO layer with a composition rich in $In_2O_3$, for example, an IZO layer composed of $In_2O_3$ and ZnO, as well as a GZO (gallium zinc oxide) layer composed of ZnO and $Ga_2O_3$, may be used.

In the organic EL element 10, the lowest unoccupied molecular orbital (LUMO) level (−4.5 eV) of the transparent electrode 3 composed of InGaZnO with a composition rich in $In_2O_3$ (a first metal oxide) is closer to the work function (−4.7 eV) of the IZO layer of the negative electrode 2 than the lowest unoccupied molecular orbital (LUMO) level (approximately −3 eV) of the electron transport layer 5 composed of InGaZnO with a composition rich in $Ga_2O_3$ (a second metal oxide).

That is, the difference between the work function (−4.7 eV) of the IZO layer of the negative electrode 2 and the lowest unoccupied molecular orbital (LUMO) level (−4.5 eV) of the first metal oxide layer is 0.2 eV, while the difference between the work function (−4.7 eV) of the IZO layer of the negative electrode 2 and the lowest unoccupied molecular orbital (LUMO) level (approximately −3 eV) of the second metal oxide layer is 1.7 eV.

Such a configuration includes at least a composite metal oxide layer (the transparent electrode 3, the electron injecting layer 4, and the electron transport layer 5) including the transparent electrode 3 (the InGaZnO layer with a composition rich in $In_2O_3$) contacting the IZO layer of the negative electrode 2, and the electron transport layer 5 (the InGaZnO layer with a composition rich in $Ga_2O_3$); and the lowest unoccupied molecular orbital (LUMO) level (−4.5 eV) of the transparent electrode 3 is closer to the work function (−4.7 eV) of the IZO layer of the negative electrode 2 than the lowest unoccupied molecular orbital (LUMO) level (approximately −3 eV) of the electron transport layer 5. In addition, the above-mentioned composite metal oxide layer (the transparent electrode 3, the electron injecting layer 4, and the electron transport layer 5) is a metal oxide layer having high carrier mobility.

Consequently, an organic electroluminescence element 10 that can satisfy both electron injection properties and electron transport properties can be achieved.

Embodiment 2

Next, Embodiment 2 of the disclosure will be described based on FIGS. 8A to 10B. In the present embodiment, examples wherein the distance between the Al layer and the light emitting layer 6 is optimized depending on the wavelength of light from the light emitting layer of each organic EL element will be described. For convenience of description, members having the same function as the members illustrated in the drawings of Embodiment 1 are appended with the same reference symbols, with the description thereof omitted.

Figures 8A, 8B:
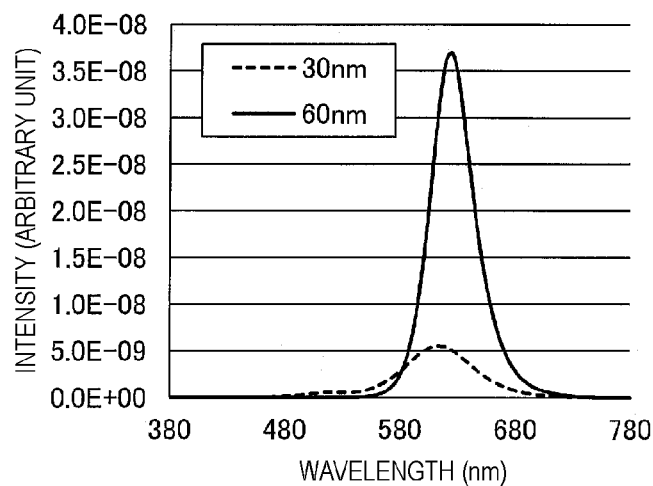
FIG. 8A is a view illustrating simulation calculation results of the extraction intensity of light from above in an organic EL element emitting red light, for film thicknesses from 30 nm and 60 nm of InGaZnO layers including three layers with different compositions.
FIG. 8B illustrates a material, thickness, and function of each layer used in the simulation calculation.

FIG. 8A is a view illustrating simulation calculation results of the extraction intensity of light from above in an organic EL element emitting red light, for film thicknesses of 30 nm and 60 nm of InGaZnO layers including three layers with different compositions, and FIG. 8B illustrates a material, thickness, and function of each layer used in the simulation calculation of FIG. 8A.

Note that as in the above-mentioned embodiment, the InGaZnO layer including three layers with different compositions is a layer composed of the InGaZnO layer with a composition rich in $In_2O_3$, the InGaZnO layer with a stoichiometric ratio of In:Ga:Zn:O=1:1:1:4, and the InGaZnO layer with a composition rich in $Ga_2O_3$.

Because this is an organic EL element emitting red light, $Alq_3$:DCJTB (2 wt %) is used as a material for the light emitting layer, with the light emitting layer formed with the film thickness of 30 nm. In addition, the peak wavelength of the red light emitted from this organic EL element is 630 nm.

As illustrated in FIG. 8A, the InGaZnO layers including three layers with different compositions are compared for film thicknesses from 30 nm and 60 nm to show that extraction intensity of light from above is higher for 60 nm at or near 630 nm, which is the peak wavelength of the light-emitting light. It is understood that because the wavelength of the light from the light emitting layer of the organic EL element emitting red light becomes longer, setting the distance between the Al layer and the light emitting layer 6 accordingly as relatively wide as 79 nm (the film thickness of the InGaZnO layer+the film thickness of the IZO layer) provides better extraction intensity from above.

Note that the film thickness of each layer of the InGaZnO layer including three layers with different compositions can be set to the following ranges as appropriate such that the film thickness of the InGaZnO layer including three layers with different compositions is 60 nm. The InGaZnO layer with a composition rich in $Ga_2O_3$ is preferably adjusted to have a film thickness of 10 nm or less, the InGaZnO layer with In:Ga:Zn:O=1:1:1:4 is preferably adjusted to have a film thickness of 20 nm or less, and the InGaZnO layer with a composition rich in $In_2O_3$ may be set such that the film thickness of the InGaZnO layer including three layers with different compositions is 60 nm.

Figures 9A, 9B:
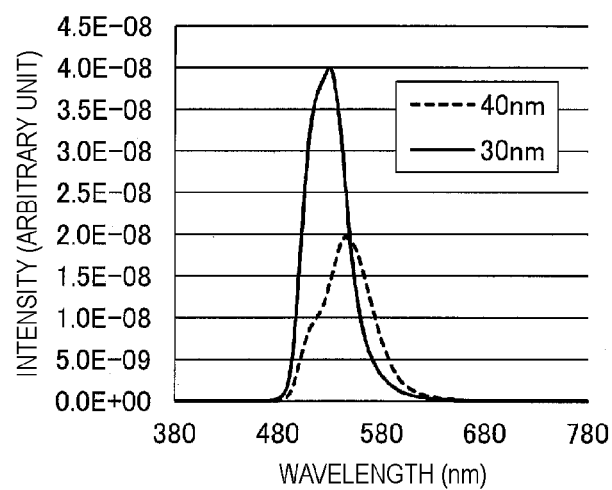
FIG. 9A is a view illustrating simulation calculation results of the extraction intensity of light from above in an organic EL element emitting green light, for film thicknesses from 30 nm and 40 nm of InGaZnO layers including three layers with different compositions.
FIG. 9B illustrates a material, thickness, and function of each layer used in the simulation calculation.

FIG. 9A is a view illustrating simulation calculation results of the extraction intensity of light from above in an organic EL element emitting green light, using a material different from that of the green light emitting layer as the light emitting layer in the above-mentioned Embodiment 1, for film thicknesses from 30 nm and 40 nm of InGaZnO layers including three layers with different compositions, and FIG. 9B illustrates a material, thickness, and function of each layer used in the simulation calculation of FIG. 9A.

Because this is an organic EL element emitting green light, $CBP:Ir(ppy)_3$ (10 wt %) is used as a material of the light emitting layer, with the light emitting layer formed with the film thickness of 30 nm. In addition, the peak wavelength of the green light emitted from this organic EL element is 520 nm.

In the above-mentioned Embodiment 1, because the $Alq_3$ layer with the light emitting layer partially exerting the function of the electron transport layer is used as the green light emitting layer, and so-called host light emission is utilized, a configuration with relatively thick film is employed, wherein the film thickness of the $Alq_3$ layer is 60 nm and the film thickness of the NPD layer, serving as the hole transport layer, is also 60 nm. In contrast, in the present embodiment, because $CBP:Ir(ppy)_3$ (10 wt %) is used as the green light emitting layer, the light emitting layer is formed with the film thickness of 30 nm, and the film thickness of the NPD layer, serving as the hole transport layer, is 10 nm in common in each organic EL element.

As illustrated in FIG. 9A, the InGaZnO layers including three layers with different compositions are compared for film thicknesses from 30 nm and 40 nm to show that extraction intensity of light from above is higher for 30 nm at or near 520 nm, which is the peak wavelength of the light-emitting light.

In addition, chromaticity for the InGaZnO layer including three layers with different compositions and with a film thickness of 40 nm is CIE (x, y)=(0.324, 0.644), while chromaticity for the InGaZnO layer including three layers with different compositions and with a film thickness of 30 nm is CIE (x, y)=(0.206, 0.717). In the InGaZnO layer including three layers with different compositions, the film thickness of 30 nm is optimal for luminance and chromaticity.

Note that the film thickness of each layer of the InGaZnO layer including three layers with different compositions can be set to the following ranges as appropriate such that the film thickness of the InGaZnO layer including three layers with different compositions is 30 nm. The InGaZnO layer with a composition rich in $Ga_2O_3$ is preferably adjusted to have a film thickness of 10 nm or less, the InGaZnO layer with In:Ga:Zn:O=1:1:1:4 is preferably adjusted to have a film thickness of less than 20 nm, and the InGaZnO layer with a composition rich in $In_2O_3$ may be set such that the film thickness of the InGaZnO layer including three layers with different compositions is 30 nm.

Figures 10A, 10B:
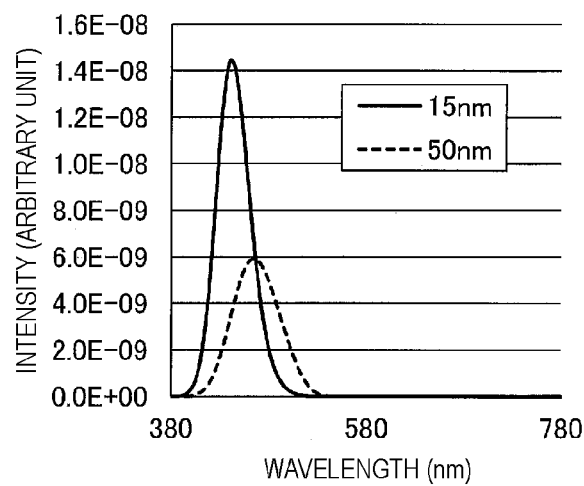
FIG. 10A is a view illustrating simulation calculation results of the extraction intensity of light from above in an organic EL element emitting blue light, for film thicknesses from 15 nm and 50 nm of InGaZnO layers including three layers with different compositions.
FIG. 10B illustrates a material, thickness, and function of each layer used in the simulation calculation.

FIG. 10A is a view illustrating simulation calculation results of the extraction intensity of light from above in an organic EL element emitting blue light, for film thicknesses of 15 nm and 50 nm of InGaZnO layers including three layers with different compositions, and FIG. 10B illustrates a material, thickness, and function of each layer used in the simulation calculation of FIG. 10A.

Because this is an organic EL element emitting blue light, Balq: perylene (1 wt %) is used as a material for the light emitting layer, with the light emitting layer formed with the film thickness of 30 nm. In addition, the peak wavelength of the blue light emitted from this organic EL element is 430 nm.

As illustrated in FIG. 10A, the InGaZnO layers including three layers with different compositions are compared for film thicknesses from 15 nm and 50 nm to show that extraction intensity of light from above is higher for 15 nm at or near 430 nm, which is the peak wavelength of the light-emitting light. It is understood that because the wavelength of the light from the light emitting layer of the organic EL element emitting blue light becomes shorter, setting the distance between the Al layer and the light emitting layer 6 accordingly as relatively narrow as 34 nm (the film thickness of the InGaZnO layer+the film thickness of the IZO layer) provides better extraction intensity from above.

Note that the film thickness of each layer of the InGaZnO layer including three layers with different compositions can be set to the following ranges as appropriate such that the film thickness of the InGaZnO layer including three layers with different compositions is 15 nm. The InGaZnO layer with a composition rich in $Ga_2O_3$ is preferably adjusted to have a film thickness of 10 nm or less, the InGaZnO layer with In:Ga:Zn:O=1:1:1:4 is preferably adjusted to have a film thickness of less than 15 nm, and the InGaZnO layer with a composition rich in $In_2O_3$ may be set such that the film thickness of the InGaZnO layer including three layers with different compositions is 15 nm.

In the organic EL element emitting red light, the organic EL element emitting green light, and the organic EL element emitting blue light according to the present embodiment, because the film thickness of the light emitting layer of each color is uniformly set to 30 nm, optical design using the change in thickness of the InGaZnO layer including three layers with different compositions is easier.

Embodiment 3

Next, Embodiment 3 of the disclosure will be described based on FIGS. 11A to 12. The present embodiment differs from Embodiments 1 and 2 in that the metal oxide layer is provided between a reflective positive electrode 22, serving as a positive electrode, and a hole transport layer 24, with others as described in Embodiments 1 and 2. For convenience of description, members having the same function as the members illustrated in the drawings of Embodiments 1 and 2 are appended with the same reference symbols, with the description thereof omitted.

Figure 11A:
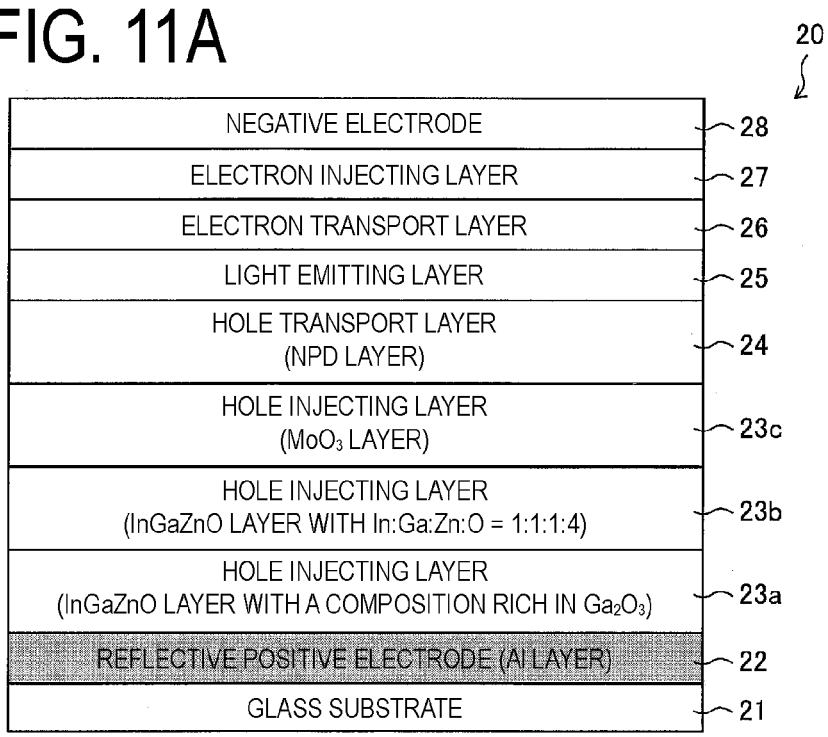
FIG. 11A is a view illustrating a schematic configuration of a top emission type microcavity organic EL element including hole injecting layers, which are metal oxide layers.
Figure 11B:
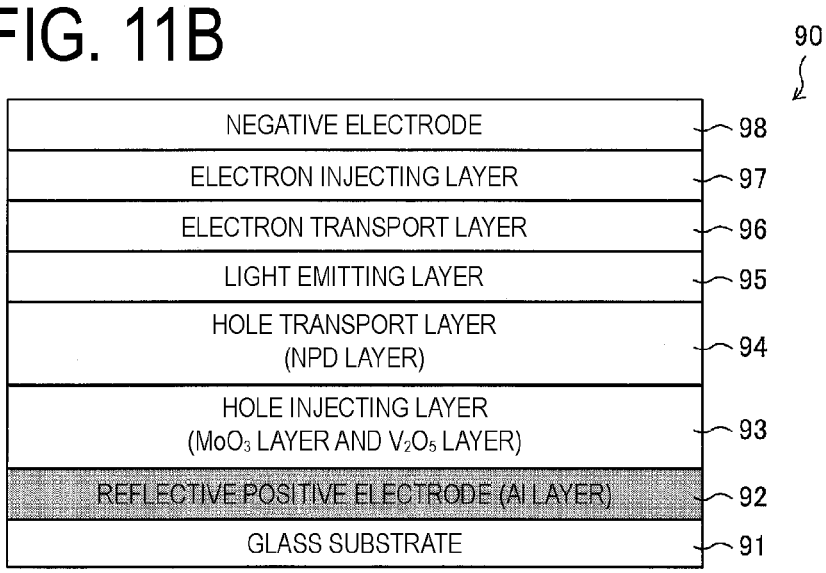
FIG. 11B is a view illustrating a schematic configuration of a known top emission type microcavity organic EL element.

FIG. 11A is a view illustrating a schematic configuration of a top emission type microcavity organic EL element 20 including hole injecting layers 23a, 23b, and 23c, which are metal oxide layers, provided between a reflective positive electrode 22 and a hole transport layer 24, and FIG. 11B is a view illustrating a schematic configuration of a known top emission type microcavity organic EL element 90.

In the known organic EL element 90 illustrated in FIG. 11B, an Al layer as a reflective positive electrode 92, an $MoO_3$ layer or a $V_2O_5$ layer as a hole injecting layer 93, an NPD layer as a hole transport layer 94, a light emitting layer 95, an electron transport layer 96, an electron injecting layer 97, and a negative electrode 98 are sequentially layered on a glass substrate 91.

The known organic EL element 90 is configured such that the $MoO_3$ layer or the V205 layer including one layer with a single composition is formed as the hole injecting layer 93 immediately above the Al layer as the reflective positive electrode 92, but satisfactory hole carrier properties can not be obtained.

In the organic EL element 20 illustrated in FIG. 11A, an Al layer as the reflective positive electrode 22, an InGaZnO layer with a composition rich in $Ga_2O_3$ as the hole injecting layer 23a, the InGaZnO layer with a stoichiometric ratio of In:Ga:Zn:O=1:1:1:4 as the hole injecting layer 23b, an $MoO_3$ layer as the hole injecting layer 23c, an NPD layer as the hole transport layer 24, a light emitting layer 25, an electron transport layer 26, an electron injecting layer 27, and a negative electrode 28 are sequentially layered on a glass substrate 21.

In order to improve the injection properties of the hole carrier in the organic EL element 20, in Embodiment 1, as already described (refer to FIG. 2B), because the valence band level (VB), i.e., the highest occupied molecular orbital (HOMO) level, of the $Ga_2O_3$ layer including $Ga_2O_3$ is −7.0 eV, and the difference from the work function (−4.7 eV) of the Al layer is the smallest (the HOMO level of the $Ga_2O_3$ layer including $Ga_2O_3$ and the work function of the Al layer are closest), the InGaZnO layer with a composition rich in $Ga_2O_3$ is formed as the hole injecting layer 23a on the Al layer as the reflective positive electrode 22.

In addition, on the InGaZnO layer with a composition rich in $Ga_2O_3$ as the hole injecting layer 23a having a low work function, the InGaZnO layer with a stoichiometric ratio of In:Ga:Zn:O=1:1:1:4 is formed as the hole injecting layer 23b, in view of preventing diffusion of $Ga^{3+}$ from the InGaZnO layer with a composition rich in $Ga_2O_3$ as the hole injecting layer 23a, and the mobility of a carrier (hole); and on the hole injecting layer 23b, the $MoO_3$ layer (the work function of −5.9 eV) as the hole injecting layer 23c is layered because the difference from the HOMO level (−5.4 eV) of the NPD layer as the hole transport layer 24 is small.

In accordance with such a configuration, an organic EL element 20 with improved injection properties of a hole carrier can be achieved.

In the organic EL element 20, the InGaZnO layer (a first metal oxide layer) with a composition rich in $Ga_2O_3$ as the hole injecting layer 23a, the InGaZnO layer (a third metal oxide layer) with a stoichiometric ratio of In:Ga:Zn:O=1:1:1:4 as the hole injecting layer 23b, and the $MoO_3$ layer (a second metal oxide layer) as the hole injecting layer 23c serve as a composite metal oxide layer.

The production process of the organic EL element 20 illustrated in FIG. 11A will be described based on FIG. 12 as follows.

Figure 12:
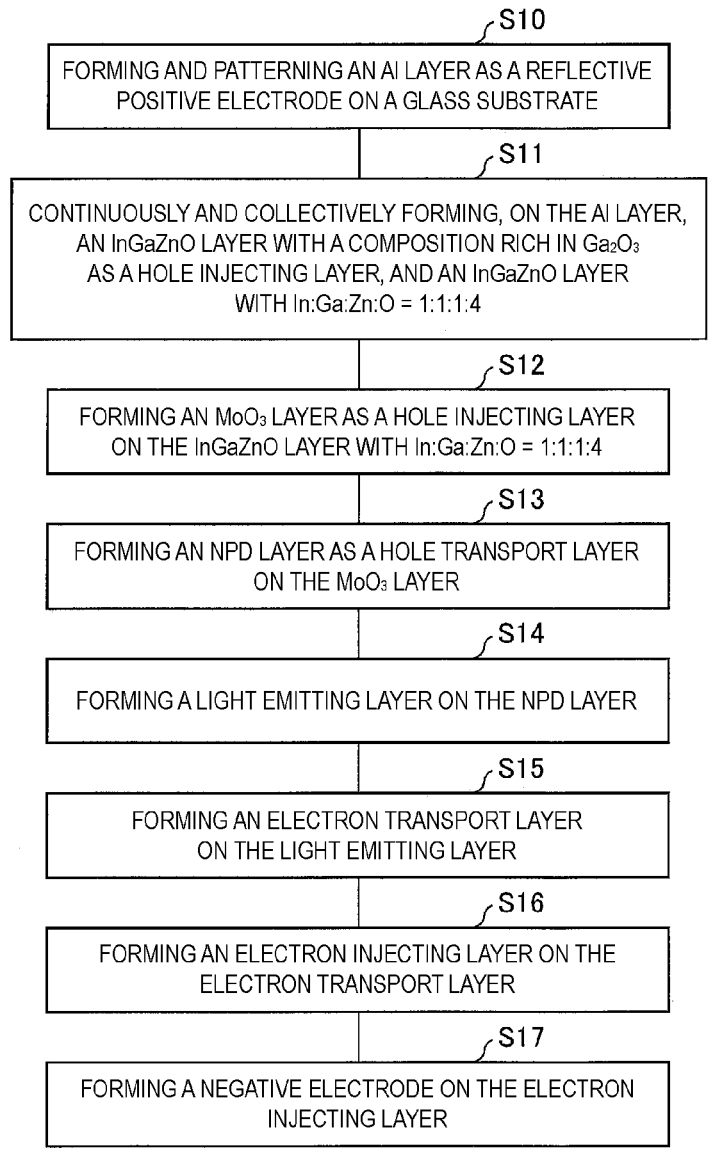
FIG. 12 is a view describing the production process of the organic EL element illustrated in FIG. 11A.

FIG. 12 is a view describing the production process of the organic EL element 20 illustrated in FIG. 11A.

As illustrated, first, in a step (S10) of forming and patterning the Al layer as the reflective positive electrode 22 on the glass substrate 21, the Al layer having a film thickness of 100 nm is deposited on the glass substrate, the Al layer is etched with phosphoric acid, nitric acid, and acetic acid, and the reflective positive electrode 22 including the Al layer can be formed in a predetermined pattern.

Described next is a step (S11) of continuously and collectively forming, on the Al layer, the InGaZnO layer with a composition rich in $Ga_2O_3$ and the InGaZnO layer with In:Ga:Zn:O=1:1:1:4, as the hole injecting layers 23a and 23b.

The InGaZnO layer with a composition rich in $Ga_2O_3$ and the InGaZnO layer with In:Ga:Zn:O=1:1:1:4 may be formed by Physical Vapor Deposition (PVD) such as sputtering and ion plating; alternatively, they may be formed by Chemical Vapor Deposition (CVD) using TMI, TMG, and DEZn gases.

The InGaZnO layer with a composition rich in $Ga_2O_3$ and the InGaZnO layer with In:Ga:Zn:O=1:1:1:4 are sequentially deposited. When these two layers are formed by PVD such as sputtering and ion plating, the two layers can be continuously and collectively formed only by changing a source material such as a target material in a deposition step for each layer. In contrast, when these two layers are formed by CVD, the three layers can be continuously and collectively formed only by changing gas mixing ratio in a deposition step for each layer.

Subsequently, a step (S12) of forming the $MoO_3$ layer as the hole injecting layer 23c on the InGaZnO layer with In:Ga:Zn:O=1:1:1:4 as the hole injecting layer 23b, a step (S13) of forming the NPD layer as the hole transport layer 24 on the $MoO_3$ layer as the hole injecting layer 23c, a step (S14) of forming the light emitting layer 25 on the NPD layer as the hole transport layer 24, a step (S15) of forming the electron transport layer 26 on the light emitting layer 25, a step (S16) of forming the electron injecting layer 27 on the electron transport layer 26, and a step (S17) of forming the negative electrode 28 on the electron injecting layer 27 are carried out to complete the production of the organic EL element 20.

In the organic EL element 20, the highest occupied molecular orbital (HOMO) level (−7.0 eV, refer to FIG. 2B) of the hole injecting layer 23a (the InGaZnO layer with a composition rich in $Ga_2O_3$) composed of InGaZnO with a composition rich in $Ga_2O_3$ (a first metal oxide) is closer to the work function (−4.7 eV) of the positive electrode 22 (the Al layer) than the highest occupied molecular orbital (HOMO) level (−7.2 eV, refer to FIG. 2B) of the hole injecting layer 23b (the InGaZnO layer with In:Ga:Zn:O=1:1:1:4) composed of InGaZnO with In:Ga:Zn:O=1:1:1:4 (a second metal oxide).

That is, the difference between the work function (−4.7 eV) of the positive electrode 22 (the Al layer) and the highest occupied molecular orbital (HOMO) level (−7.0 eV) of the first metal oxide layer is 2.3 eV, while the difference between the work function (−4.7 eV) of the positive electrode 22 (the Al layer) and the highest occupied molecular orbital (HOMO) level (−7.2 eV) of the second metal oxide layer is 2.5 eV.

Such a configuration includes at least a composite metal oxide layer (the hole injecting layers 23a, 23b, and 23c) including the hole injecting layer 23a (the InGaZnO layer with a composition rich in $Ga_2O_3$) contacting the positive electrode 22, and the hole injecting layer 23b (the InGaZnO layer with In:Ga:Zn:O=1:1:1:4); and the highest occupied molecular orbital (HOMO) level (−7.0 eV) of the hole injecting layer 23a is closer to the work function (−4.7 eV) of the positive electrode 22 (the Al layer) than the highest occupied molecular orbital (HOMO) level (−7.2 eV) of the hole injecting layer 23b. In addition, the above-mentioned composite metal oxide layer (the hole injecting layers 23a, 23b, and 23c) is a metal oxide layer having high carrier mobility.

Consequently, an organic electroluminescence element 20 that can satisfy both hole injection properties and hole transport properties can be achieved.

Embodiment 4

Next, Embodiment 4 of the disclosure will be described based on FIGS. 13A and 13B. The present embodiment differs from Embodiment 3 in that a copper oxide layer is used as a metal oxide layer provided between the reflective positive electrode 22, serving as a positive electrode, and the hole transport layer 24, with others as described in Embodiment 3. For convenience of description, members having the same function as the members illustrated in the figures of Embodiment 3 are appended with the same reference symbols, with the description thereof omitted.

Figure 13A:
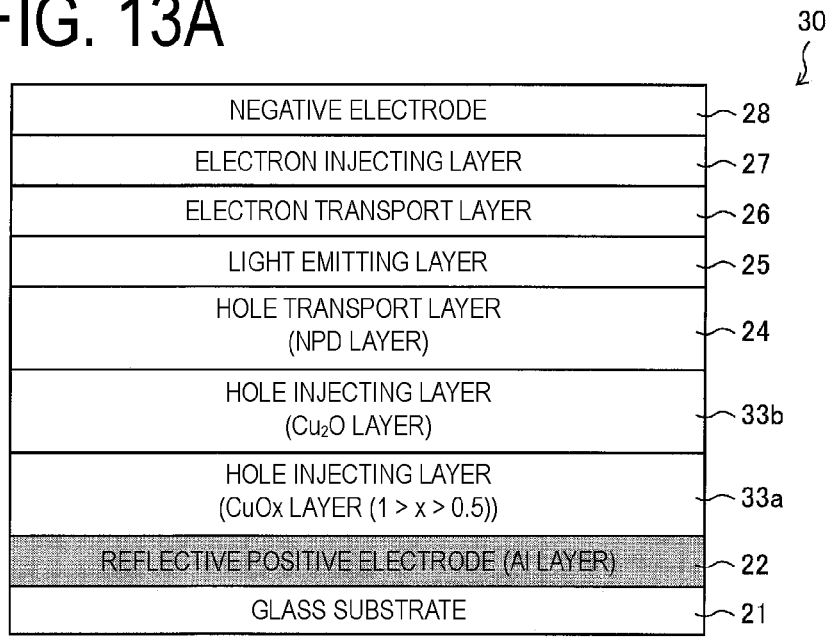
FIG. 13A is a view illustrating a schematic configuration of an organic EL element including a $CuO_X$ (1>X>0.5) layer and a $Cu_2O$ layer as hole injecting layers.
Figure 13B:
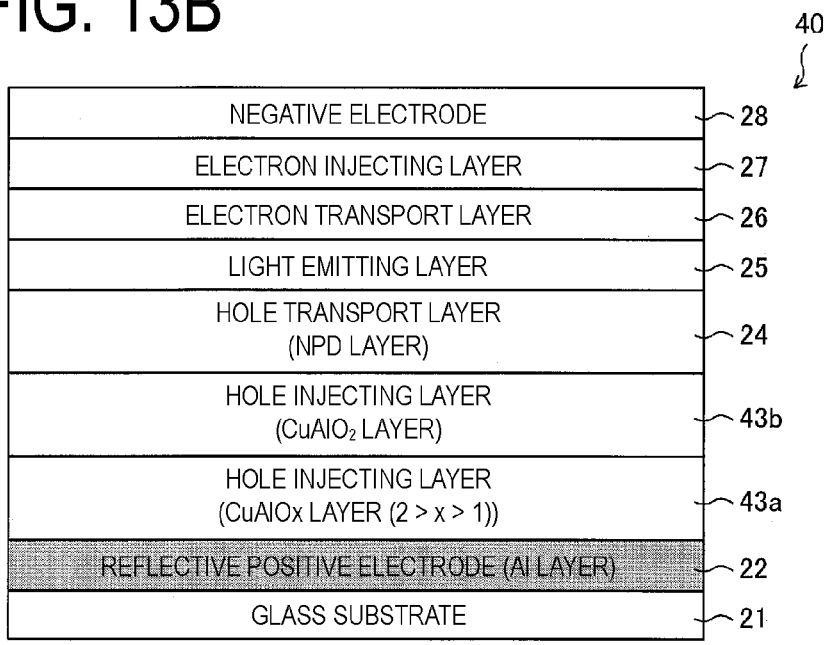
FIG. 13B is a view illustrating a schematic configuration of an organic EL element including a $CuAlO_X$ (2>X>1) layer and a $CuAlO_2$ layer as hole injecting layers.
Figure 14A:
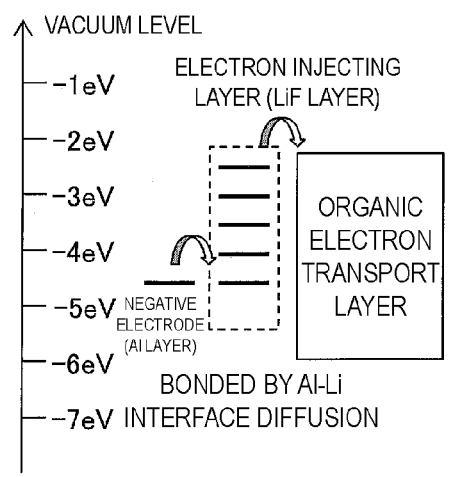
FIG. 14A is a view describing injection properties and transport properties of an electron carrier in a known organic EL element.
Figure 14B:
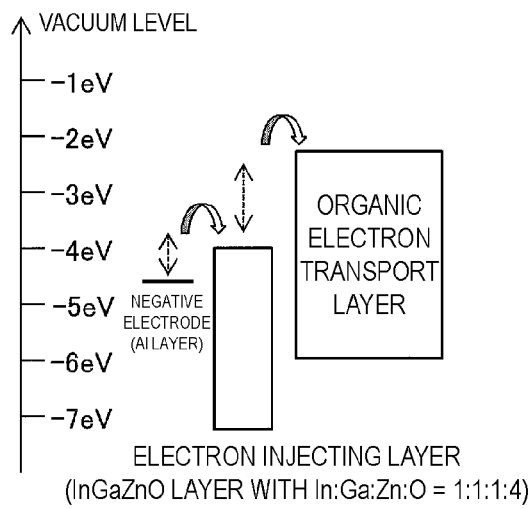
FIG. 14B is a view describing injection properties and transport properties of the electron carrier in the organic EL element using the above-mentioned InGaZnO layer with a single composition instead of an LiF layer as an electron injecting layer.
Figure 15A:
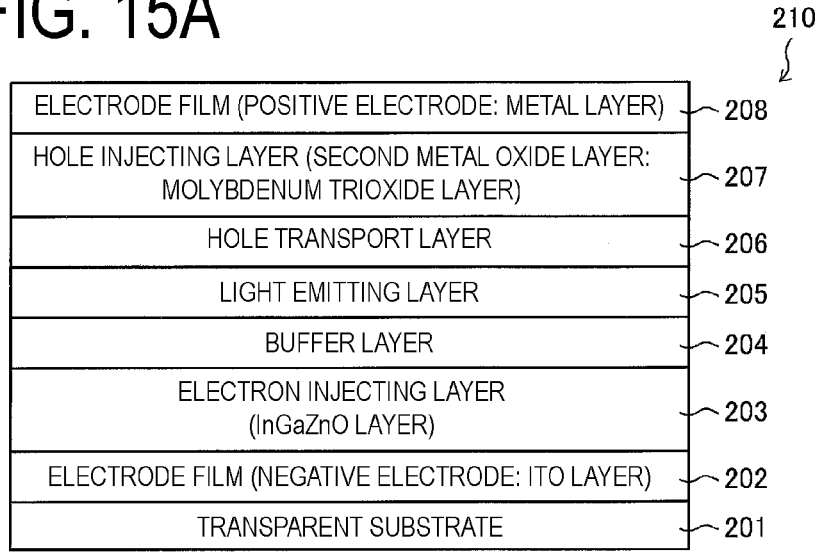
FIG. 15A is a view illustrating a schematic configuration of an organic EL element disclosed in PTL 1.
Figure 15B:
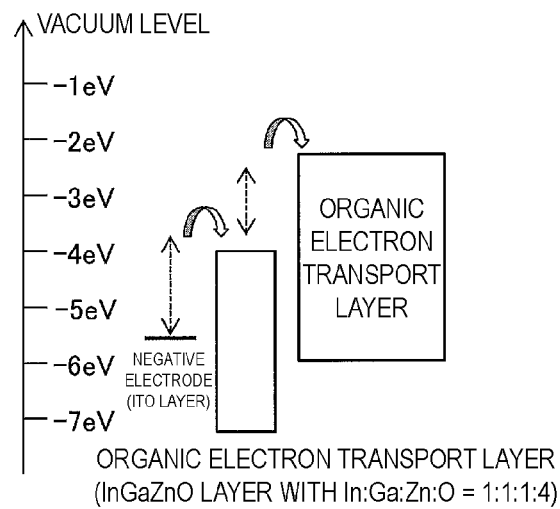
FIG. 15B is a view describing injection properties and transport properties of an electron carrier in the organic EL element using an ITO layer as a negative electrode and using the above-mentioned InGaZnO layer with a single composition as an electron injecting layer.

FIG. 13A is a view illustrating a schematic configuration of an organic EL element 30 including a $CuO_X$ (1>X>0.5) layer and a $Cu_2O$ layer as hole injecting layers 33a and 33b, and FIG. 13B is a view illustrating a schematic configuration of an organic EL element 40 including a $CuAlO_X$ (2>X>1) layer and a $CuAlO_2$ layer as hole injecting layers 43a and 43b.

In the organic EL element 30 illustrated in FIG. 13A, the $CuO_X$ (1>X>0.5) layer as the hole injecting layer 33a, and the $Cu_2O$ layer as the hole injecting layer 33b are sequentially layered between the reflective positive electrode 22, serving as a positive electrode, and the hole transport layer 24. Note that $Cu_2O$ corresponds to X=0.5 in $CuO_X$.

$CuO_X$ is by nature stable in CuO corresponding to X=1; and $Cu_2O$ corresponding to X=0.5 and $CuO_X$ (1>X>0.5), which is a mixed state (intermediate phase) of CuO and $Cu_2O$, are present.

In the organic EL element 30, because the valence band level (VB), i.e., the highest occupied molecular orbital (HOMO) level (−5.6 eV), of the $CuO_X$ (1>X>0.5) layer is closer to the work function (−4.7 eV) of an Al layer than the HOMO level (−5.7 eV) of the $Cu_2O$ layer, the $CuO_X$ (1>X>0.5) layer is formed as the hole injecting layer 33a on the Al layer as the reflective positive electrode 22. Note that the work function (−5.0 eV) of the $Cu_2O$ layer is closer to the HOMO level (−5.4 eV) of the NPD layer as the hole transport layer 24 than the work function (−5.5 eV) of the $CuO_X$ (1>X>0.5) layer. Consequently, an organic EL element 30 with improved injection properties of a hole carrier can be achieved.

In the organic EL element 30, the $CuO_X$ (1>X>0.5) layer (a first metal oxide layer) and the $Cu_2O$ layer (a second metal oxide layer) form a composite metal oxide layer.

In the organic EL element 30, the highest occupied molecular orbital (HOMO) level (−5.6 eV) of the hole injecting layer 33a (the $CuO_X$ (1>X>0.5) layer) composed of the $CuO_X$ (1>X>0.5) (a first metal oxide) is closer to the work function (−4.7 eV) of the positive electrode 22 (the Al layer) than the highest occupied molecular orbital (HOMO) level (−5.7 eV) of the hole injecting layer 33b (the $Cu_2O$ layer) composed of $Cu_2O$ (a second metal oxide).

That is, the difference between the work function (−4.7 eV) of the positive electrode 22 (the Al layer) and the highest occupied molecular orbital (HOMO) level (−5.6 eV) of the first metal oxide layer is 0.9 eV, while the difference between the work function (−4.7 eV) of the positive electrode 22 (the Al layer) and the highest occupied molecular orbital (HOMO) level (−5.7 eV) of the second metal oxide layer is 1.0 eV.

Such a configuration comprises a composite metal oxide layer including the hole injecting layer 33a (the $CuO_X$ (1>X>0.5) layer) contacting the positive electrode 22, and the hole injecting layer 33b (the $Cu_2O$ layer); and the highest occupied molecular orbital (HOMO) level (−5.6 eV) of the hole injecting layer 33a is closer to the work function (−4.7 eV) of the positive electrode 22 (the Al layer) than the highest occupied molecular orbital (HOMO) level (−5.7 eV) of the hole injecting layer 33b (the $Cu_2O$ layer). In addition, the above-mentioned composite metal oxide layer (the hole injecting layers 33a and 33b) is a metal oxide layer having high carrier mobility.

Consequently, an organic electroluminescence element 30 that can satisfy both hole injection properties and hole transport properties can be achieved.

In the organic EL element 40 illustrated in FIG. 13B, the $CuAlO_X$ (2>X>1) layer as the hole injecting layer 43a and the $CuAlO_2$ layer as the hole injecting layer 43b are sequentially layered between the reflective positive electrode 22, serving as a positive electrode, and the hole transport layer 24. Note that $CuAlO_2$ corresponds to X=2 in $CuAlO_X$.

$CuAlO_2$ by nature variously changes from $CuAlO_2$ corresponding to X=2, to an oxygen deficient state corresponding to X<2, and to a composition of $CuAl_2O_4$. Because a high conductivity state is readily obtained in an oxygen deficient state, however, the $CuAlO_X$ (2>X>1) layer is used as the hole injecting layer 43a contacting the reflective positive electrode 22, serving as a positive electrode.

In the organic EL element 40, the valence band level (VB), i.e., the highest occupied molecular orbital (HOMO) level (−5.0 eV), of the $CuAlO_X$ (2>X>1) layer is closer to the work function (−4.7 eV) of an Al layer than the HOMO level (−5.2 eV) of the $CuAlO_2$ layer, the $CuAlO_X$ (2>X>1) layer is formed as the hole injecting layer 43a on the Al layer as the reflective positive electrode 22. Note that the work function (−4.9 eV) of the $CuAlO_2$ layer is closer to the HOMO level (−5.4 eV) of the NPD layer as the hole transport layer 24 than the work function (−4.4 eV) of the $CuAlO_X$ (2>X>1) layer. Consequently, an organic EL element 40 with improved injection properties of a hole carrier can be achieved.

In the organic EL element 40, the $CuAlO_X$ (2>X>1) layer (a first metal oxide layer) and the $CuAlO_2$ layer (a second metal oxide layer) form a composite metal oxide layer.

In the organic EL element 40, the highest occupied molecular orbital (HOMO) level (−5.0 eV) of the hole injecting layer 43a (the $CuAlO_X$ (2>X>1) layer) composed of $CuAlO_X$ (2>X>1) (a first metal oxide) is closer to the work function (−4.7 eV) of the positive electrode 22 (the Al layer) than the highest occupied molecular orbital (HOMO) level (−5.2 eV) of the hole injecting layer 43b (the $CuAlO_2$ layer) composed of $CuAlO_2$ (a second metal oxide).

That is, the difference between the work function (−4.7 eV) of the positive electrode 22 (the Al layer) and the highest occupied molecular orbital (HOMO) level (−5.0 eV) of the first metal oxide layer is 0.3 eV, while the difference between the work function (−4.7 eV) of the positive electrode 22 (the Al layer) and the highest occupied molecular orbital (HOMO) level (−5.2 eV) of the second metal oxide layer is 0.5 eV.

Such a configuration includes a composite metal oxide layer including the hole injecting layer 43a (the $CuAlO_X$ (2>X>1) layer) contacting the positive electrode 22, and the hole injecting layer 43b (the $CuAlO_2$ layer); and the highest occupied molecular orbital (HOMO) level (−5.0 eV) of the hole injecting layer 43a (the $CuAlO_X$ (2>X>1) layer) is closer to the work function (−4.7 eV) of the positive electrode 22 (the Al layer) than the highest occupied molecular orbital (HOMO) level (−5.2 eV) of the hole injecting layer 43b (the $CuAlO_2$ layer). In addition, the above-mentioned composite metal oxide layer (the hole injecting layers 43a and 43b) is a metal oxide layer having high carrier mobility.

Consequently, an organic electroluminescence element 40 that can satisfy both hole injection properties and hole transport properties can be achieved.

Supplement

An organic electroluminescence element according to Aspect 1 of the disclosure includes:

a positive electrode;

a negative electrode; and a light emitting layer provided between the positive electrode and the negative electrode;

wherein between either one electrode of the positive electrode or the negative electrode and the light emitting layer, at least a composite metal oxide layer including a first metal oxide layer contacting the one electrode and a second metal oxide layer is formed, the first metal oxide layer is composed of a first metal oxide including one or more metal oxides, and the second metal oxide layer is composed of a second metal oxide including one or more metal oxides, and one orbital level of the lowest unoccupied molecular orbital level and the highest occupied molecular orbital level of the first metal oxide layer is closer to the work function of the one electrode than the one orbital level of the second metal oxide layer.

In accordance with the above-mentioned configuration, at least the composite metal oxide layer including the first metal oxide layer contacting the one electrode and the second metal oxide layer is provided; and one orbital level of the lowest unoccupied molecular orbital level and the highest occupied molecular orbital level of the first metal oxide layer is closer to the work function of the one electrode than the one orbital level of the second metal oxide layer. In addition, the above-mentioned composite metal oxide layer is a metal oxide layer having high carrier mobility.

Consequently, an organic electroluminescence element that can satisfy both injection properties and transport properties of a carrier (electron or hole) can be achieved.

In the organic electroluminescence element according to Aspect 2 of the disclosure, in Aspect 1, the lowest unoccupied molecular orbital level of the first metal oxide layer is preferably closer to the work function of the negative electrode than the lowest unoccupied molecular orbital level of the second metal oxide layer, each layer provided in the composite metal oxide layer preferably includes the same plural kinds of metal oxides, and the composition ratios of the same plural kinds of metal oxides are preferably different in the first metal oxide and the second metal oxide.

In accordance with the above-mentioned configuration, an organic electroluminescence element including the first metal oxide and the second metal oxide including the same plural kinds of metal oxides in different composition ratios can be achieved.

In the organic electroluminescence element according to Aspect 3 of the disclosure, in Aspect 2, the second metal oxide layer is preferably a layer contacting the light emitting layer, each layer provided in the composite metal oxide layer preferably includes indium oxide, gallium oxide, and zinc oxide, the first metal oxide preferably contains more indium oxide than the second metal oxide, and the second metal oxide preferably contains more gallium oxide than the first metal oxide.

In accordance with the above-mentioned configuration, an organic electroluminescence element including: the first metal oxide layer including the first metal oxide rich in indium oxide, and the second metal oxide layer including the second metal oxide rich in gallium oxide can be achieved; and an organic electroluminescence element that can satisfy both electron injection properties and electron transport properties can be achieved.

In the organic electroluminescence element according to Aspect 4 of the disclosure, in Aspect 3, the composite metal oxide layer preferably includes a third metal oxide layer including a third metal oxide with a stoichiometric ratio of In:Ga:Zn:O=1:1:1:4 provided between the first metal oxide layer and the second metal oxide layer.

In accordance with the above-mentioned configuration, an organic electroluminescence element including the third metal oxide layer between the first metal oxide layer and the second metal oxide layer can be achieved.

In the organic electroluminescence element according to Aspect 5 of the disclosure, in any of Aspects 2 to 4, one of the positive electrode and the negative electrode preferably includes a reflective layer, the other of the positive electrode and the negative electrode is preferably a semitransparent reflective electrode, and the distance between the reflective layer and the semitransparent reflective electrode is preferably adjusted by changing the thickness of the composite metal oxide layer depending on the wavelength of light from the light emitting layer.

In accordance with the above-mentioned configuration, a microcavity (microresonator) organic electroluminescence element can be achieved.

In the organic electroluminescence element according to Aspect 6 of the disclosure, in Aspect 5, the reflective layer may be included in the negative electrode, and the positive electrode may be layered over the negative electrode.

In accordance with the above-mentioned configuration, an organic electroluminescence element wherein the negative electrode including the reflective layer is disposed in a layer lower than the positive electrode can be achieved.

The organic electroluminescence element according to Aspect 7 of the disclosure, in Aspect 1, may be configured such that:

the highest occupied molecular orbital level of the first metal oxide layer is closer to the work function of the positive electrode than the highest occupied molecular orbital level of the second metal oxide layer, the first metal oxide layer and the second metal oxide layer include indium oxide, gallium oxide, and zinc oxide, and the first metal oxide contains more gallium oxide than the second metal oxide.

In accordance with the above-mentioned configuration, an organic electroluminescence element including the first metal oxide layer and the second metal oxide layer can be achieved, wherein the first metal oxide layer and the second metal oxide layer include indium oxide, gallium oxide, and zinc oxide; and the first metal oxide contains more gallium oxide than the second metal oxide.

The organic electroluminescence element according to Aspect 8 of the disclosure, in Aspect 7, may be configured such that the second metal oxide layer includes a second metal oxide with a stoichiometric ratio of In:Ga:Zn:O=1:1:1:4.

In accordance with the above-mentioned configuration, an organic electroluminescence element including the second metal oxide layer including the second metal oxide with a stoichiometric ratio of In:Ga:Zn:O=1:1:1:4 can be achieved.

The organic electroluminescence element according to Aspect 9 of the disclosure, in Aspect 1, may be configured such that:

the highest occupied molecular orbital level of the first metal oxide layer is closer to the work function of the positive electrode than the highest occupied molecular orbital level of the second metal oxide layer, and each layer of the composite metal oxide layer includes metal oxide containing copper.

In accordance with the above-mentioned configuration, an organic electroluminescence element including a composite metal oxide layer including metal oxide containing copper can be achieved.

In the organic electroluminescence element according to Aspect 10 of the disclosure, in any of Aspects 7 to 9, one of the positive electrode and the negative electrode preferably includes a reflective layer, the other of the positive electrode and the negative electrode is preferably a semitransparent reflective electrode, and the distance between the reflective layer and the semitransparent reflective electrode is preferably adjusted by changing the thickness of the composite metal oxide layer depending on the wavelength of light from the light emitting layer.

In accordance with the above-mentioned configuration, a microcavity (microresonator) organic electroluminescence element can be achieved.

In the organic electroluminescence element according to Aspect 11 of the disclosure, in Aspect 10, the reflective layer may be included in the positive electrode, and the negative electrode may be layered over the positive electrode.

In accordance with the above-mentioned configuration, an organic electroluminescence element wherein the positive electrode including the reflective layer is disposed in a layer lower than the negative electrode can be achieved.

An organic electroluminescence display device according to Aspect 12 of the disclosure includes a plurality of the organic electroluminescence elements according to any of Aspects 1 to 11.

In accordance with the above-mentioned configuration, an organic electroluminescence display device that can satisfy both injection properties and transport properties of a carrier (electron or hole) can be achieved.

A method for producing an organic electroluminescence element according to Aspect 13 of the disclosure includes:

forming a positive electrode;

forming a negative electrode; and forming a light emitting layer between the positive electrode and the negative electrode;

wherein the method further includes forming, between either one electrode of the positive electrode or the negative electrode and the light emitting layer, at least a composite metal oxide layer including a first metal oxide layer contacting the one electrode and a second metal oxide layer, in forming the composite metal oxide layer, the first metal oxide layer and the second metal oxide layer are formed such that one orbital level of the lowest unoccupied molecular orbital level and the highest occupied molecular orbital level of the first metal oxide layer composed of a first metal oxide including one or more metal oxides is closer to the work function of the one electrode than the one orbital level of the second metal oxide layer composed of a second metal oxide including one or more metal oxides.

In accordance with the above-mentioned method, because an organic electroluminescence element including the composite metal oxide layer including the first metal oxide layer contacting the above-mentioned one electrode and the second metal oxide layer can be produced, an organic electroluminescence element that can satisfy both injection properties and transport properties of a carrier (electron or hole) can be achieved.

The method for producing an organic electroluminescence element according to Aspect 14 of the disclosure, in Aspect 13, may be a method;

wherein the first metal oxide layer is a layer contacting the negative electrode, the second metal oxide layer is a layer contacting the light emitting layer, each layer provided in the composite metal oxide layer includes indium oxide, gallium oxide, and zinc oxide, forming the composite metal oxide layer includes forming the first metal oxide layer including the first metal oxide containing more indium oxide than the second metal oxide, and forming the second metal oxide layer including the second metal oxide containing more gallium oxide than the first metal oxide.

In accordance with the above-mentioned method, an organic electroluminescence element including the first metal oxide layer including the first metal oxide rich in indium oxide, and the second metal oxide layer including the second metal oxide rich in gallium oxide can be achieved.

The method for producing an organic electroluminescence element according to Aspect 15 of the disclosure, in Aspect 14, may be a method, wherein forming the composite metal oxide layer includes forming a third metal oxide layer between the first metal oxide layer and the second metal oxide layer, and in forming the third metal oxide layer, the third metal oxide layer including a third metal oxide with a stoichiometric ratio of In:Ga:Zn:O=1:1:1:4 is formed.

In accordance with the above-mentioned method, an organic electroluminescence element comprising the third metal oxide layer between the first metal oxide layer and the second metal oxide layer can be produced.

The method for producing an organic electroluminescence element according to Aspect 16 of the disclosure, in Aspect 15, may be a method, wherein forming the first metal oxide layer, forming the second metal oxide layer, and forming the third metal oxide layer are continuously carried out while changing a source material or gas mixing ratio.

In accordance with the above-mentioned method, forming the first metal oxide layer, forming the second metal oxide layer, and forming the third metal oxide layer can be continuously carried out, and the first metal oxide layer, the second metal oxide layer, and the third metal oxide layer can be collectively formed.

The method for producing an organic electroluminescence element according to Aspect 17 of the disclosure, in Aspect 13, may be a method wherein the first metal oxide layer is a layer contacting the positive electrode, the first metal oxide layer and the second metal oxide layer include indium oxide, gallium oxide, and zinc oxide, the first metal oxide contains more gallium oxide than the second metal oxide, and forming the first metal oxide layer and forming the second metal oxide layer are continuously carried out while changing a source material or gas mixing ratio.

In accordance with the above-mentioned method, forming the first metal oxide layer and forming the second metal oxide layer can be continuously carried out, and the first metal oxide layer and the second metal oxide layer can be collectively formed.

The method for producing an organic electroluminescence element according to Aspect 18 of the disclosure, in any of Aspects 13 to 17, may be a method, wherein forming the negative electrode including a reflective layer is carried out prior to forming the positive electrode.

In accordance with the above-mentioned method, because forming the negative electrode including a reflective layer is carried out prior to forming the positive electrode, an organic electroluminescence element wherein the negative electrode including the reflective layer is disposed in a layer lower than the positive electrode can be produced.

The method for producing an organic electroluminescence element according to Aspect 19 of the disclosure, in any of Aspects 13 to 17, may be a method, wherein forming the positive electrode including a reflective layer is carried out prior to forming the negative electrode.

In accordance with the above-mentioned method, because forming the positive electrode including a reflective layer is carried out prior to forming the negative electrode, an organic electroluminescence element wherein the positive electrode including the reflective layer is disposed in a layer lower than the negative electrode can be produced.

Appendix

The disclosure is not limited to each embodiment described above, various modifications can be implemented within the scope described in the claims, and embodiments obtained by combining technical approaches disclosed respectively in the different embodiments also fall within the technical scope of the disclosre. Moreover, novel technical features may be formed by combining the technical approaches disclosed respectively in each embodiment.

INDUSTRIAL APPLICABILITY

The discloser can be utilized in an organic electroluminescence element, an organic electroluminescence display device, and a method for producing an organic electroluminescence element.

REFERENCE SIGNS LIST

1 Glass substrate
2 Negative electrode
3 Transparent electrode (first metal oxide layer)
4 Electron injecting layer (third metal oxide layer)
5 Electron transport layer (second metal oxide layer)
6 Light emitting layer
7 Hole transport layer
8 Hole injecting layer
9 Positive electrode (semitransparent reflective electrode)

10 Organic EL element (organic electroluminescence element)
11 Layered film
20 Organic EL element (organic electroluminescence element)
21 Glass substrate
22 Reflective positive electrode (positive electrode)
23a Hole injecting layer (first metal oxide layer)
23b Hole injecting layer (second metal oxide layer)
23c Hole injecting layer
24 Hole transport layer (carrier transport layer)
25 Light emitting layer
26 Electron transport layer
27 Electron injecting layer
28 Negative electrode (semitransparent reflective electrode)
30 Organic EL element (organic electroluminescence element)
33a Hole injecting layer (first metal oxide layer)
33b Hole injecting layer (second metal oxide layer)
40 Organic EL element (organic electroluminescence element)
43a Hole injecting layer (first metal oxide layer)
43b Hole injecting layer (second metal oxide layer)
70 Organic EL display device (organic electroluminescence display device)
71 Sealing resin
72 Sealing substrate

The invention claimed is:

1. An organic electroluminescence element comprising:
a positive electrode;
a negative electrode; and
a light emitting layer provided between the positive electrode and the negative electrode; wherein
between either one electrode of the positive electrode or the negative electrode and the light emitting layer, at least a composite metal oxide layer including a first metal oxide layer contacting the one electrode and a second metal oxide layer is formed,
the first metal oxide layer is composed of a first metal oxide including one or more metal oxides, and the second metal oxide layer is composed of a second metal oxide including one or more metal oxides, and
one orbital level of a lowest unoccupied molecular orbital level and a highest occupied molecular orbital level of the first metal oxide layer is closer to a work function of the one electrode than one orbital level of the second metal oxide layer.

2. The organic electroluminescence element according to claim 1, wherein
the highest occupied molecular orbital level of the first metal oxide layer is closer to a work function of the positive electrode than a highest occupied molecular orbital level of the second metal oxide layer, and
each layer of the composite metal oxide layer includes metal oxide containing copper.

3. An organic electroluminescence display device, comprising a plurality of the organic electroluminescence elements according to claim 1.

4. The organic electroluminescence element according to claim 1, wherein
the highest occupied molecular orbital level of the first metal oxide layer is closer to a work function of the positive electrode than a highest occupied molecular orbital level of the second metal oxide layer,
the first metal oxide layer and the second metal oxide layer include indium oxide, gallium oxide, and zinc oxide, and
the first metal oxide contains more gallium oxide than the second metal oxide.

5. The organic electroluminescence element according to claim 4, wherein the second metal oxide layer includes a second metal oxide with a stoichiometric ratio of In:Ga:Zn:O=1:1:1:4.

6. The organic electroluminescence element according to claim 4, wherein
one of the positive electrode and the negative electrode includes a reflective layer,
the other of the positive electrode and the negative electrode is a semitransparent reflective electrode, and
a distance between the reflective layer and the semitransparent reflective electrode is adjusted by changing a thickness of the composite metal oxide layer depending on a wavelength of light from the light emitting layer.

7. The organic electroluminescence element according to claim 6, wherein
the reflective layer is included in the positive electrode, and
the negative electrode is layered over the positive electrode.

8. The organic electroluminescence element according to claim 1, wherein
the lowest unoccupied molecular orbital level of the first metal oxide layer is closer to a work function of the negative electrode than a lowest unoccupied molecular orbital level of the second metal oxide layer,
each layer provided in the composite metal oxide layer includes same plural types of metal oxides, and
composition ratios of the same plural types of metal oxides are different in the first metal oxide and the second metal oxide.

9. The organic electroluminescence element according to claim 8, wherein
the second metal oxide layer is a layer contacting the light emitting layer,
each layer provided in the composite metal oxide layer includes indium oxide, gallium oxide, and zinc oxide,
the first metal oxide contains more indium oxide than the second metal oxide, and
the second metal oxide contains more gallium oxide than the first metal oxide.

10. The organic electroluminescence element according to claim 9, wherein the composite metal oxide layer includes a third metal oxide layer including a third metal oxide with a stoichiometric ratio of In:Ga:Zn:O=1:1:1:4 provided between the first metal oxide layer and the second metal oxide layer.

11. The organic electroluminescence element according to claim 8, wherein
one of the positive electrode and the negative electrode includes a reflective layer,
the other of the positive electrode and the negative electrode is a semitransparent reflective electrode, and
a distance between the reflective layer and the semitransparent reflective electrode is adjusted by changing a thickness of the composite metal oxide layer depending on a wavelength of light from the light emitting layer.

12. The organic electroluminescence element according to claim 11, wherein
the reflective layer is included in the negative electrode, and
the positive electrode is layered over the negative electrode.

13. A method for producing an organic electroluminescence element comprising:

forming a positive electrode;
forming a negative electrode; and
forming a light emitting layer between the positive electrode and the negative electrode; wherein
the method further includes forming, between either one electrode of the positive electrode or the negative electrode and the light emitting layer, at least a composite metal oxide layer including a first metal oxide layer contacting the one electrode and a second metal oxide layer,
in forming the composite metal oxide layer, the first metal oxide layer and the second metal oxide layer are formed such that one orbital level of a lowest unoccupied molecular orbital level and a highest occupied molecular orbital level of the first metal oxide layer composed of a first metal oxide including one or more metal oxides is closer to a work function of the one electrode than one orbital level of the second metal oxide layer composed of a second metal oxide including one or more metal oxides.

14. The method for producing an organic electroluminescence element according to claim 13, wherein
the first metal oxide layer is a layer contacting the positive electrode,
the first metal oxide layer and the second metal oxide layer include indium oxide, gallium oxide, and zinc oxide,
the first metal oxide contains more gallium oxide than the second metal oxide, and
forming the first metal oxide layer and forming the second metal oxide layer are continuously carried out while changing a source material or gas mixing ratio.

15. The method for producing an organic electroluminescence element according to claim 13, wherein forming the negative electrode including a reflective layer is carried out prior to forming the positive electrode.

16. The method for producing an organic electroluminescence element according to claim 13, wherein forming the positive electrode including a reflective layer is carried out prior to forming the negative electrode.

17. The method for producing an organic electroluminescence element according to claim 13, wherein
the first metal oxide layer is a layer contacting the negative electrode,
the second metal oxide layer is a layer contacting the light emitting layer,
each layer provided in the composite metal oxide layer includes indium oxide, gallium oxide, and zinc oxide,
forming the composite metal oxide layer includes
forming the first metal oxide layer including the first metal oxide containing more indium oxide than the second metal oxide, and
forming the second metal oxide layer including the second metal oxide containing more gallium oxide than the first metal oxide.

18. The method for producing an organic electroluminescence element according to claim 17, wherein
forming the composite metal oxide layer includes forming a third metal oxide layer between the first metal oxide layer and the second metal oxide layer, and
in forming the third metal oxide layer, the third metal oxide layer including a third metal oxide with a stoichiometric ratio of $In:Ga:Zn:O=1:1:1:4$ is formed.

19. The method for producing an organic electroluminescence element according to claim 18, wherein forming the first metal oxide layer, forming the second metal oxide layer, and forming the third metal oxide layer are continuously carried out while changing a source material or gas mixing ratio.

* * * * *